United States Patent [19]

Opris et al.

[11] Patent Number: 5,668,549
[45] Date of Patent: Sep. 16, 1997

[54] RADIX 2 ARCHITECTURE AND CALIBRATION TECHNIQUE FOR PIPELINED ANALOG TO DIGITAL CONVERTERS

[75] Inventors: Ion E. Opris, Stanford; Laurence D. Lewicki, Sunnyvale, both of Calif.

[73] Assignee: National Semiconductor Corporation, Santa Clara, Calif.

[21] Appl. No.: 337,253

[22] Filed: Nov. 10, 1994

[51] Int. Cl.$^6$ .............................. H03M 1/38; H03M 1/06
[52] U.S. Cl. ............................................ 341/118; 341/161
[58] Field of Search ................................. 341/118, 120, 341/156, 158, 161, 162, 163, 172

[56] References Cited

U.S. PATENT DOCUMENTS

| | | | |
|---|---|---|---|
| 4,760,376 | 7/1988 | Kobayashi et al. | 341/172 |
| 5,027,116 | 6/1991 | Armstrong et al. | 341/120 |
| 5,510,789 | 4/1996 | Lee | 341/120 |

FOREIGN PATENT DOCUMENTS

| | | |
|---|---|---|
| A 0 214 831 | 3/1987 | European Pat. Off. |
| A 1 523 123 | 8/1978 | United Kingdom . |
| A 2 223 137 | 3/1990 | United Kingdom . |

OTHER PUBLICATIONS

Patent Abstracts of Japan vol. 60 No. 87 (e–108), 25 May 1982 &JP, A 80 097804 (Advantesst ) 6 Feb. 1982.
"A 10–b 20–Msample/s Analog–to–Digital Converter," by Stephen H. Lewis, H.Scott Fetterman, George F. Gross, Jr., R. Ramachandran, and T.R. Viswanathan, *IEEE Journal of Solid–State Circuits*, vol. 27, No. 3, Mar. 1992, pp. 351–358.
"A 12–b 600 ks/s Digitally Self–Calibrated Pipelined Algorithmic ADC," by Hae–Seung Lee, *IEEE Journal of Solid–State Circuits*, vol. 29, No. 4, Apr. 1994, pp. 509–515.
"A 15–b 1–Msample/s Digitally Self–Calibrated Pipeline ADC," by Andrew N. Karanicolas, Hae–Seung Lee, and Kantilal L. Bacrania, *IEEE Journal of Solid–State Circuits*, vol. 28, No. 12, Dec. 1993, pp. 1207–1215.

"Clever Designs Spawn 40–MHz/10–Bit/0.2–W ADCS", by Frank Goodenough, *Electronic Design*, Jan. 24, 1994, pp. 123–128.

*Primary Examiner*—Howard L. Williams
*Attorney, Agent, or Firm*—Limbach & Limbach L.L.P.

[57] ABSTRACT

In a pipelined radix 2 analog to digital converter, a method of analog residue formation uses an overflow reduction stage which takes an analog input and outputs a digital value of +2, 0, or −2 and an analog residue which is twice the analog input minus the digital output value times a reference voltage. A calibration technique allows a pipelined analog to digital converter using the overflow reduction stages to produce a corrected output requiring one addition per pipeline stage. The residue portion of the overflow reduction stage can be constructed using an operational amplifier, two capacitors, one of which has twice the capacitance of the other, and three on-off type switches. A radix 2 pipelined converter is constructed using a combination of standard 1-bit stages and overflow reduction stages. The analog residue is passed from stage to stage as an amplifier remainder as the digital codes are extracted in a pipelined analog to digital converter. The overflow reduction stage reduces out-of-range residues back to in-range residues. Using three digital output values where the difference between any two is greater than one raw output code prevents the possibility of multiple representations of the same code and thus allows for the prevention of non-monotonic input-output transfer functions. The self-calibration and raw output code correction schemes prevent non-monotonicities and missing codes in the input-output transfer functions.

6 Claims, 19 Drawing Sheets

TABLE 1

| CODE | RAW OUTPUT DATA BITS | | | | | | | |
|---|---|---|---|---|---|---|---|---|
| | MSB | | | ----------> | | | LSB | |
| 29 | 0 | 1 | 0 | 0 | −1 | 0 | 1 | LOWEST INPUT VOLTAGE |
| 29 | 0 | 1 | 0 | 0 | −1 | 1 | −1 | |
| 30 | 0 | 1 | 0 | 0 | −1 | 1 | 0 | |
| 30 | 0 | 1 | 0 | 0 | 0 | −1 | 0 | |
| 31 | 0 | 1 | 0 | 0 | 0 | −1 | 1 | |
| 31 | 0 | 1 | 0 | 0 | 0 | 0 | −1 | |
| 32 | 0 | 1 | 0 | 0 | 0 | 0 | 0 | |
| 30 | 1 | −1 | 0 | 0 | 0 | −1 | 0 | |
| 31 | 1 | −1 | 0 | 0 | 0 | 0 | −1 | |
| 32 | 1 | −1 | 0 | 0 | 0 | 0 | 0 | |
| 33 | 1 | −1 | 0 | 0 | 0 | 0 | 1 | |
| 33 | 1 | −1 | 0 | 0 | 0 | 1 | −1 | HIGHEST INPUT VOLTAGE |

RADIX 2 ARCHITECTURE AND CALIBRATION TECHNIQUE FOR PIPELINED ANALOG TO DIGITAL CONVERTERS

BACKGROUND OF THE INVENTION

1. Field of the Invention

The present invention relates to pipelined analog to digital converters. Particularly, this invention discloses a new pipelined stage design which has a different scheme for producing the digital outputs and the analog residue.

2. Description of the Related Art

In the field of analog to digital (A/D) conversion, increasing the speed and precision of the conversions is desirable. For example, 5 MHz sampling rates are needed in hand-held CCD document scanners; high-end scanners and low-end video applications require 10 MHz sampling rates; and standardbroadcast video cameorders need 20 MHz sampling. Furthermore, high-end video applications take advantage of over-sampling at 25 MHz; automotive collision-avoidance radar receivers undersample at 25MHz, and medical ultrasound scanners and professional broadcast-studio video equipment want 40 MHz sampling rates. In addition, digital communication applications undersample in the 20-to-25 MHz range.

Today A/D converters need to produce as much as 40 Megasamples per second (MS/sec) at 12 bits per sample while still providing a reasonably low latency. There are several techniques currently used to achieve the speeds. For example, parallel-encoded flash, multi-step, pipeline, and time-interleaved successive approximation are some of the techniques.

Flash A/D encoding is the fastest method of conversion, because it is essentially performed in a single step. FIG. 1 shows a typical flash A/D structure. For an N-bit encoded output, the input voltage is sent to $2^N$ comparators which each compare the input to a different reference voltage. All of the comparators whose reference voltage is higher than the input voltage will produce a logical true output. A priority encoder then generates a digital output corresponding to the lowest comparator whose output was activated. The delay time from input to output equals the sum of comparator plus encoder delays. Although this latency does not increase significantly with the size of the encoded output, the sheer size of the circuit essentially doubles with each additional output bit desired. Thus, the size of flash A/D makes that approach prohibitively expensive for many modern applications.

Multi-step encoding is a variant on the simple parallel flash encoding. A three-step twelve bit A/D is shown in FIG. 2. In the first stage, the four most significant bits are generated by a standard four bit flash circuit similar to the one discussed above. A four-bit digital to analog (D/A) converter then converts the output of the first stage back to analog. The difference in voltage between the input and the output of the converter is then fed into a second stage. The second stage has a reference voltage which is $2^{-4}$ times (one sixteenth) the reference voltage used in the first stage. The second most significant four bits are produced by the second stage, and another four bit D/A converts the value back into an analog signal, which is subtracted from the difference obtained from the subtractor of the previous stage. Finally, the last stage has a reference voltage which is $2^{-4}$ times the voltage of the previous stage, or $2^{-8}$ (one two-hundred-fifty-sixth) times the original reference voltage. This stage produces the four least significant bits of the result. All twelve bits are then latched, and the output is available for use.

Successive approximation is a prior art method of producing the output bits in order of descending significance. FIG. 3 is an example of a successive approximation circuit. In one implementation, all bits of the register are initially set to zero, then the most significant bit is set to a one, thus forming an initial guess. This guess is converted to analog by a D/A, and the output of the D/A is compared to the input voltage using a standard comparator. If the input voltage is higher than the analog guess, the most significant bit remains a one, otherwise, the most significant bit is set to back to zero. In the next steps, the next most significant bits are provisionally set to one, and comparisons are similarly done to determine each bit. Essentially, an iterative binary search is performed until the least significant bit is determined.

There are several other types of popular A/D converters which use charge balancing on a capacitor to facilitate A/D conversion. Some of those methods including voltage to frequency conversion, single-slope integration, dual-slope integration, delta-sigma converters, and switched capacitor converters. See, for example, Horowitz, P., and Hill, W., *The Art of Electronics*, 2nd Ed., Cambridge University Press, 1989, pp. 621–629.

Several of the above-mentioned A/D converter strategies can be pipelined. A typical N-bit pipelined A/D converter consists of J, K-bit stages, where $J*K=N$. For example, five stages (J=5) each producing 2 bits K=2) would result in a 10 bit converter.

FIG. 4A shows a single stage of a pipelined A/D converter. FIG. 4B shows a multistage pipeline architecture using the single stage of FIG. 4A. In FIG. 4A, the analog input is sampled and held. The result is converted to a K-bit digital code by a analog to digital subconverter. If this is the first stage, the K-bits produced are the most significant bits of the final output. This digital code is used by a local digital to analog converter to create the analog equivalent of the K-bit digital code. This estimate is then subtracted from the original analog input to create a residue, which is essentially the analog remainder. The resulting analog residue is then multiplied by $2^K$ and sent to the next stage. The resulting residue can be calculated from the following formula.

$$Vres_i = 2^K * (Vres_{i-1} - Vdac_i) \quad (1)$$

Each stage can be identically designed, unlike the multi-stage flash encoding discussed earlier, in which each successive stage has a lower reference voltage. In the pipelined A/D converter, because the residues are multiplied by $2^K$, each successive stage has the same range of input voltages, rather than having that range geometrically decreasing toward zero.

If the D/A converter in each stage is linear, the D/A converter output will be represented as follows.

$$Vdac_i = D_i * 2^{-K} * Vref \quad (2)$$

In Equation 2, $D_i$ is the binary representation of the K-bit digital code determined in each stage. $D_i * 2^{-K}$ merely represent the fraction of $V_{ref}$ which has already been encoded and is to be subtracted from the analog remainder $Vres_{i-1}$. $V_{ref}$ is set such that the input voltage $Vres_i$ will always be less than $V_{ref}$. The remainder is multiplied by $2^K$ before being sent to the next stage. The central problem with this scheme, however, is that the overall linearity of the total converter is dependent upon all the digital to analog conversions being linear. For a digital to analog conversion to be linear, the differences in output voltage $Vdac_i$ for each one bit increment of the input $D_i$ must all be equal.

There are two ways in which this problem has been attacked. The first way involves setting K=1. Thus, each stage produces only one bit. In this case, the analog to digital subconverter produces only a one bit code. If K=1, the digital to analog converter in each stage only has two possible output voltages. This D/A conversion will always be linear, since there is always a straight line that can be drawn between two points. In this case, the ideal gain of each converter stage is two. By substituting K=1, Equations 1 and 2 produce the following residue equation.

$$Vres_i = 2*Vres_{i-1} - D_i*Vref \quad (3)$$

It is helpful to think of $D_i$ as representing either of the two values −1 or +1. A simple circuit such as the one shown in FIG. 5 is typically used to generate the residue. Operation of this circuit is simple. A two-phase non-overlapping clock is used to generate control of the circuit.

FIG. 5A shows the circuit in its sampling phase. During the sampling phase, switches $S_{1A}$, $S_{1B}$, and $S_{1C}$ are all closed, and switches $S_{2A}$ and $S2_B$ are open. Switch $S_{1C}$ holds the operational amplifier as a follower. Switches $S_{1A}$ and $S_{1B}$ cause the input voltage $Vres_{i-1}$ to be sampled on both capacitors Cap1 and Cap2, respectively. Thus, both capacitors are charged to a voltage of $Vres_{i-1}$. A one-bit analog to digital converter is just a comparator. At this time, the comparator compares $Vresi_{i-1}$ with ground, producing the digital output $D_i$ as follows.

$D_i=1$ if $Vres_i-1>0$, and $D_i=-1$ if $Vres_i-1<0$ \quad (4)

FIG. 5B shows the circuit in its output phase. During the second phase of the non-overlapping clock, switches $S_{2A}$ and $S_{2B}$ are closed, while switches $S_{1A}$, $S_{1B}$, and $S_{1C}$ are open. Capacitor Cap1 is connected to the output of the operational amplifier by Switch $S_{2B}$, while Cap2 is connected by Switch $S_{2A}$ to either $+V_{ref}$ or $-V_{ref}$ depending on the digital output code $D_i$. Assuming that Cap1 and Cap2 have equal capacitances C, by connecting Capacitor Cap2 to either $+V_{ref}$ or $-V_{ref}$, the output of the operational amplifier is forced to the desired residue given by Equation 3.

However, in the non-ideal real world it is impossible to exactly realize the transfer function of Equation 3. First, it is impossible to make the capacitances of Cap1 and Cap2 exactly the same. The variable $\alpha_i$ represents the capacitor mismatch for stage i. Cap1 has a capacitance of C, while Cap2 has a capacitance of $(1+\alpha_i)*C$. Second, a real operational amplifier does not have infinite gain and does not settle instantaneously, but rather has a finite gain and non-zero settling time. Errors due to the finite gain and non-zero settling time in stage i are represented by $\epsilon_i$. Another source of error is charge injection onto the capacitors due to Switch $S_{1C}$. Furthermore, an ideal operational amplifier has a zero output when the inputs are shorted together; in contrast, an actual operational amplifier has a non-zero output voltage when the inputs are shorted together due to imperfect matching of components within the operational amplifier. $Vofs_i$ represents the total offset in stage i due to the sum of charge injection effects and operational amplifier offset. When the three error factors $\alpha_i$, $\epsilon_i$, and $Vofs_i$ are introduced into the derivation, the real world transfer function is as follows.

$$Vres_i=[(2+\alpha_i)*Vres_i-1-(1+\alpha_i)D_i*Vref](1-\epsilon_i)+Vofs_i \quad (5)$$

FIG. 6A shows the ideal one bit per stage residue transfer function. The x-axis shows the range of input residues while the y-axis shows the resulting output residues. Note that the slope from $(-V_{ref}, -V_{ref})$ to $(0, +V_{ref})$ and from $(0, -V_{ref})$ to $(+V_{ref}, +V_{ref})$ is two; therefore, this stage has an ideal gain of two.

FIG. 6B shows the effect of capacitor mismatch $\epsilon_i$. Capacitor mismatch errors do not shift the endpoints of the transfer characteristic, but they shift the slope and thus the residue at the transition points. If $\alpha_i$ is negative, Cap2 is less than Cap1, the slope of the transfer function is less than two, and the $Vres_i$ output range is less than $-V_{ref}$ to $+V_{ref}$. On the other hand, if $\epsilon_i$ is positive, Cap2 is greater than Cap1, the slope of the transfer function is greater than two, and the $Vres_i$ output range is greater than $-V_{ref}$ to $+V_{ref}$.

FIG. 6C shows the effect of errors due to finite operational amplifier gain and/or incomplete operational amplifier settling ($\epsilon_i$). Error due to $\epsilon_i$ shifts the endpoints as well as introducing errors in the residue transfer characteristic at the transition points, while preserving the correct output only at the points $(-V_{ref}, 0)$ and $(+V_{ref}, 0)$.

FIG. 6D shows the effect of errors due to charge injection and operational amplifier offset ($Vofs_i$). These errors shift the whole characteristic vertically. This does not introduce a gain error but the end points and the residue transfer characteristic at the transition point is shifted.

FIG. 6E shows the effect of errors due to comparator offset. These errors essentially just change input voltage $Vres_{i-1}$ at which the transition from $D_i=-1$ to $D_i=1$ occurs. Instead of occurring at $Vres_{i-1}=0$, this transition will occur at some higher or lower input voltage. This does not introduce a gain error, but the end points and the residue transfer characteristic at the transition point is shifted. Errors due to comparator offset alter the Equations 4 governing the determination of the Din bits as follows.

$D_i=1$ if $Vres_i-1+Vco_i>0$, and $D_i=-1$ if $Vres_i-1+Vco_i<0$ \quad (6)

Gain variances are created by capacitor mismatch and by finite operational amplifier gain and settling. Any of the above errors which affect the gain, such as those depicted in FIGS. 6B and 6C, will cause differential nonlinearity problems with the converter. If the cascade of N converters has a gain larger than $2^N$ and the overall error is more than 1 least significant bit, then at least one A/D converter output code will correspond to a range of input voltages greater than the minimum required resolution of the converter. On the other hand, if the gain of the cascade is less than $2^N$ by at least one least significant bit, then missing output codes will result since some output codes will be skipped as the input changes incrementally.

Moreover, if the output residue of a stage happens to be above $+V_{ref}$ or below $-V_{ref}$ for any reason, then the output bits of remaining subsequent stages will all latch to +1 or −1 respectively. This can occur as a consequence of any of the previously mentioned sources of error, such as too large a gain or vertical or horizontal shifting, if the input voltage just happens to place the output of that stage outside the acceptable range. The phenomenon occurs because an output above $+V_{ref}$ or below $-V_{ref}$ necessarily supplies the next stage with an input which is outside its intended range. That stage will supply the following stage with an output which is twice is far out of range as its input was. Essentially, once the output one stage goes out of range, that excess is multiplied by the gain factor for each additional stage. After very few stages, all the remaining stages are outputting residues that are essentially either the positive or negative supply voltage, and all the remaining coded bits coming out after that stage reaches the power supply limitation are meaningless.

The typical way that has been used to protect against this very catastrophic situation is to introduce an intentionally reduced gain. (Radix 1.95 is typical.) FIG. 7 shows the transfer function of a Radix<2 stage. The range of possible outputs is less than $-V_{ref}$ to $+V_{ref}$. This allows for a margin of error which can be designed large enough so that it is extremely unlikely that any of the errors will put the output voltage outside the acceptable input range. If any of the above-mentioned errors significantly affect the shape of the transfer curve, they can be accommodated by the built-in safety zone.

Unfortunately, however, the reduced gain necessitates the use of more stages to encode the overall output. Since the output bits now are essentially base 1.95 rather than base 2 numbers, and a complex correction equivalent to a series of nested multiplications is required to do the final conversion.

The major drawback with all of the systems using radix less than two techniques is that they require this large complex conversion circuit to transform the number from a radix less than 2 representation into a true binary base 2 representation. In many systems, this final translation is so complex that it is performed in software, greatly adding to the latency of the corrected output. If the final translation is implemented in hardware, and especially if that hardware is designed to run at frequencies as high as 40 MHz, this final conversion uses an inordinately large amount of power, silicon area, and generates noise which interferes with the performance of the analog sections of the A/D converter system. The proposed architecture of the present invention eliminates the need for a radix conversion circuit.

A second pipelined converter evolutionary path has developed independently which utilizes large amount of redundancy. The technique has been referred to as a "1.5 bit per stage pipelined" architecture. The 1.5 bit stage derives its name from the fact that each stage has three possible outputs, rather than only two in 1 bit stages. This amount of redundancy, which asymptotically approaches 100% as the number of output bits N increases, eliminates the effects of comparator offset errors up to $V_{ref}/4$. This technique appears to be manufacturable up to the 10-bit level, at 20 MS/sec. For accuracies greater than 10-bits, calibration becomes necessary to compensate for the other errors due to capacitor mismatch, operational amplifier offset, charge injection, and finite operational amplifier gain and settling.

The 1.5 bit per stage architectures derive their insensitivity to analog to digital subconverter offsets by reducing their gain by a factor of two. The most typical configurations detect two bits per stage but with an interstage gain of two instead of four. Then it was realized that the two bits per stage could be achieved with only two comparators per stage, thereby reducing power. See S. Lewis, et al., "A 10-bit 20 Msample/s Analog-Digital-Converter", IEEE J. Solid State Circuits, vol. SC-27, no.3, pp. 351–358, March 1992. The two comparators per stage only realize three states instead of four, but the fourth state can be inferred by carry overflow in the final arithmetic. Because there are three states, requiring two bits, detected per stage but the interstage gain is two, a redundancy level of almost 100% is realized. A N-stage A/D converter, with no nonlinearities, has $2^{N+1}$ output codes but has $2(2^{(N+1)}-N-2)$ unique states. Some of the unique states represent the same output codes. Thus, two or more unique states may represent the same output code. So an 11 stage converter ideally has 4096 output codes but 8166 states. In other words, 4070 states are redundant in that they represent the same output codes which are already represented by some other state.

The residue of the 1.5 bit per stage converter is shown in FIG. 8. In the middle portion of the transfer function the ideal peaks at the transitions are only $+V_{ref}/2$ and $-V_{ref}/2$.

This residue design solves the problem of errors due to charge injection and offset in that there is room for $\pm V_{ref}/2$ error due to incorrect decision levels or charge injection. The equation of the transfer characteristic is the same as that for the one bit per stage design—Equation 3. However, the equation for the data bits detected at each stage is different.

$D_i=1$ if $V_{res}>+V_{ref}/4$, $D_i=0$ if $-V_{ref}/4<V_{res}<+V_{ref}/4$, and $D_i=-1$ if $V_{res}<-V_{ref}/4$. (7)

The digitized representation of the input voltage is as follows.

$$V_{in} \approx V_{ref} \sum_{i=0}^{N-1} \frac{D_i}{2^i+1} \quad (8)$$

At this point it is useful to consider a numerical example. Consider a converter with N=7; this produces an 8 bit output code. The output sequence in Table 1 was generated thorough simulation given an increasing analog input voltage with large random gain errors on the order of 5 %.

The first noteworthy observation is that several of the codes are represented by more than one set of output bit sequences. For instance, 29, 30, 31, 32, and 33, are each non-uniquely represented in Table 1. For each of these redundancies, one of the following two relations holds true.

$2*D_i+D_{i+1}=-1$ (9A)

$2*D_i+D_{i+1}=1$ (9B)

What this means, for example, is that 3 can be represented as $1(4)+-1(2)+1(1)$ or as $1(4)+0(2)+-1(1)$. In this example $D_i$ is the second least significant bit, and $D_i$ is the least significant bit, such that $2*D_i+D_{i+1}=-1$ since $2*-1+1$ and $2*0+-1$ both equal $-1$. To illustrate the other situation, 5 can be represented as $1(4)+0(2)+1(1)$ or as $1(4)+1(2)+-1(1)$. Here, $D_i$ is the second least significant bit, and $D_{i+1}$ is the least significant bit, such that $2*D_i+D_{i+1}=1$ since $2*0+1$ and $2*1+-1$ both equal $+1$.

The second noteworthy observation is that the output codes are non-monotonic. Since the analog input voltage increased steadily throughout the table, a proper A/D coding would have produced a monotonic output. This means that the output code should either increase or remain the same at each subsequent sample, but it should never decrease. Here, the output code jumps from 32 back to 30 in the middle of the table. This is a perfect example of a non-monotonic output.

FIGS. 9A, 9B, and 9C show an analog input and two A/D converted output codes as an illustration of the difference between monotonic and non-monotonic outputs. FIG. 9A shows the analog input; FIG. 9B shows a non-monotonic output; FIG. 9C shows a monotonic output.

The 1.5 bit per stage structure is extremely insensitive to offsets due to the operational amplifier, charge injection, and the A/D subconverter comparator. However, it does not correct for linearity errors due to finite operational amplifier gain and/or capacitor mismatch.

Several implementations exist that provide a "self-calibration" scheme. See S. H. Lewis, H. S. Fetterman, G. F. Gross, Jr., R. Ramachandran, And T. R. Viswanathan, "A 10-bit 20 Msample/s Analog-to-Digital Converter," IEEE J. Solid-State Circuits, vol. SC-27, pp. 351–358, March 1992; B. Ginetti P. G. A. Jespers, and A. Vandemeulebroecke, "A CMOS 13-b Cyclic RSD A/D Converter," IEEE J. Solid-State Circuits, vol. SC-27, pp. 957–965, July 1992; H. S.

Lee, "A 12-b 600 ks/s Digitally Self-Calibrated Pipelined Algorithmic ADC," IEEE J. Solid-State Circuits, vol. SC-29, pp. 509–515, April 1994. None of these schemes can guarantee a monotonic characteristic after correction. Self-calibration uses the converter, in a calibration configuration, to measure the capacitor mismatch, and then forms a digital correction value based on the raw code. The monotonicity problem occurs for the very large class of A/D converter architectures in which multiple representations of the same output codes occur.

To illustrate the idea, a n-stage (n+1 bits) A/D converter with a 1.5 bit per stage implementation is considered. Each data bit $D_i$ can take three different values: 31 1, 0, +1. The digital representation of the input is given by the following equation.

$$V_{in} = V_{ref} \sum_{i=0}^{n-1} \frac{D_i}{2^{i+1}} \tag{10}$$

The self-calibrating correction algorithm adds a correction term to this digital representation. Very generally, this correction term is of the form below.

$$\epsilon_i = \sum_{i=0}^{n-1} D_i * \phi_i(\alpha_0, \alpha_1, \ldots \alpha_i) \tag{11}$$

In Equation 11, $\phi_i(\alpha_0, \alpha_1, \ldots \alpha_i)$ is a function of the capacitor mismatches for stage i and all preceding stages. If $\alpha_i$ represents the capacitor mismatches, the functions $\phi_i(\alpha_0, \alpha_1, \ldots \alpha_i)$ are given below.

$$\phi_i^*(\alpha_0, \alpha_1, \ldots \alpha_i) = 2^{-(i+2)*(\alpha_0 + \alpha_1 + \alpha_{i-1} - \alpha_i)} \tag{12}$$

In the ideal case when there are no gain errors, the total number of states in the converter can be calculated as $2^{n+2} - 2*(n+2)$. As n gets larger, the average number of representations for each output code approaches two asymptotically. These multiple internal states occur at the common transition points of data bits $D_i$ and $D_{i+1}$ with the rest of the data bits unchanged. From residue considerations, the following multiple representations appear in sequence for increasing input values.

$$D_i 32 - 1, D_{i+1} = 1 \tag{13a}$$

$$D_i = 0, D_{i+1} = -1 \tag{13b}$$

Equations 13a and 13b are the solutions to Equation 9A. If all other raw output data bits are the same, and if one output satisfies Equation 13a while the other satisfies Equation 13b, both outputs represent the same code and thus are dual representations of the same code. However, the analog input that generated the raw output corresponding to Equation 13a was lower than the other by an amount less than 1 least significant bit of precision. Similarly, the following equations are the solutions to Equation 9b.

$$D_i = 0, D_{i+1} = 1 \tag{14a}$$

$$D_i = 1, D_{i+1} = -1 \tag{14b}$$

It is also true that the analog input that produced the raw output corresponding to Equation 14a was lower than the other by an amount less than 1 least significant bit of precision.

Therefore, a necessary condition for monotonicity is that whenever multiple representations of the form 13a and 13b occur, the correction term (Equation 11) calculated for the representation 13a is less than the corresponding correction term for 13b. The same must be valid for multiple representations of the forms 14a and 14b.

For any stage that has only two non-zero output values which are negatives of each other, such as a 1.5 bit per stage converter or a 1-bit per stage converter, a linear correction algorithm is one that assumes that the correction value for the positive output is the negative of the correction value for the negative output.

Using any linear correction algorithm, the necessary conditions for monotonicity become the following.

for all i=0,1, ... n-2, $$\phi_i(\alpha_0, \alpha_1, \ldots \alpha_i) \geq 2\phi_{i+1}^*(\alpha_0, \alpha_1, \ldots \alpha_{i+1}) \tag{15}$$

Substituting the relations of Equation 9, into the constraints in Equations 12, the monotonicity conditions are as follows.

$$\alpha_{i+1} \geq 2*\alpha_i, \text{ for } i=0,1, \ldots n-2 \tag{16}$$

The constraints in 16 are equivalent to a reduced nominal gain for each calibrated stage. Equation 16 established restrictions on the gain mismatches, which are not apriori satisfied. This further implies that non-monotonic behavior may occur even after the digital correction, or, equivalently, the correction algorithm can not guarantee the converter's monotonicity.

In the example shown in Table 1, the non-monotonic behavior of the raw output code is generated by the interstage gain errors. The correction algorithm should be able to identify all possible multiple representations and correctly resolve the monotonicity conditions. However, since the gain mismatches are essentially random, it is impossible to guarantee the satisfaction of the constraints in 16.

The powerful conclusion that can be dram from Equation 15 is that monotonicity can not be guaranteed in general for arbitrary gain mismatches for any A/D converter architecture that generates multiple representations of the same output code. This conclusion is valid for any linear correction algorithm that computes an error term as a function of stored self-calibrating data and raw data bits.

SUMMARY OF THE INVENTION

In pipelined analog to digital conversion, many converters have the problems of missing digital output codes, non-monotonic digital output, overflow amplification error, and complicated radix conversions. Missing digital output codes occur when not all of the possible digital output codes can be produced by the converter and thus some codes are skipped. A non-monotonic digital output occurs when a smooth analog increasing "ramp" input produces a digital output which does not steadily increase, but rather decreases or jumps backwards at times. Overflow amplification error occurs when a stage of a pipelined analog to digital converter produces an analog remainder or residue which is outside the intended input range for the next stage, such that the next stage amplifies the amount that the residue is out of range, and within a few stages, the remaining stages hit the power supply voltage, so that the converter no longer is in a linear range and is thus no longer converting. Radix conversion is necessary when the average gain of each stage significantly and substantially departs from 2, so that the final output must be adjusted using a calculation which can be as difficult as a series of nested multiplications in order to convert the output. The present invention solves all of the above problems.

In a pipelined radix 2 analog to digital converter, a method of analog residue formation uses an overflow reduction stage which takes an analog input and outputs a digital value of +2, 0, or −2 and an analog residue which is twice the analog input minus the digital output value times a reference voltage. This digital output leads to raw code outputs which all represent different corrected output codes so that no multiple representations exist. A calibration technique allows a pipelined analog to digital converter using the overflow reduction stages to produce a corrected output requiring one addition per pipeline stage. Calibration of such raw codes allows a monotonic corrected output to be produced.

Instead of amplifying interstage analog overflow, the analog residue scheme of the present invention prevents the occurrence of overflow amplification since any analog input to an overflow reduction stage which is out of range will be brought back into range. This overflow elimination property is a consequence of the shape of the input/output characteristic; out-of-range inputs are mapped to in-range outputs near zero. Specifically, the overflow reduction stage has its lowest output levels at the extremes of its input range, so that gaining up of interstage errors does not exceed the input range of subsequent stages. The residue portion of the overflow reduction stage can be constructed using an operational amplifier, two capacitors, one of which has twice the capacitance of the other, and three on-off type switches.

An overall pipelined converter design uses a combination of standard 1-bit stages and overflow reduction stages to perform a radix 2 analog to digital conversion. A radix 2 pipelined converter is constructed using a combination of standard 1-bit stages and overflow reduction stages. The analog residue is passed from stage to stage as an amplifier remainder as the digital codes are extracted in a pipelined analog to digital converter. The overflow reduction stage reduces out-of-range residues back to in-range residues. Using three digital output values where the difference between any two is greater than one raw output code prevents the possibility of multiple representations of the same code and thus allows for the prevention of non-monotonic input-output transfer functions. The self-calibration and raw output code correction schemes prevent non-monotonicities and missing codes in the input-output transfer functions. Since the converter is radix 2, no radix conversion is necessary because the result is already a valid binary representation.

Table 1 shows the simulated digital output for a prior art analog to digital converter having an a monotonically increasing analog input and random gain errors on the order of 5% per stage.

Figure 9A:
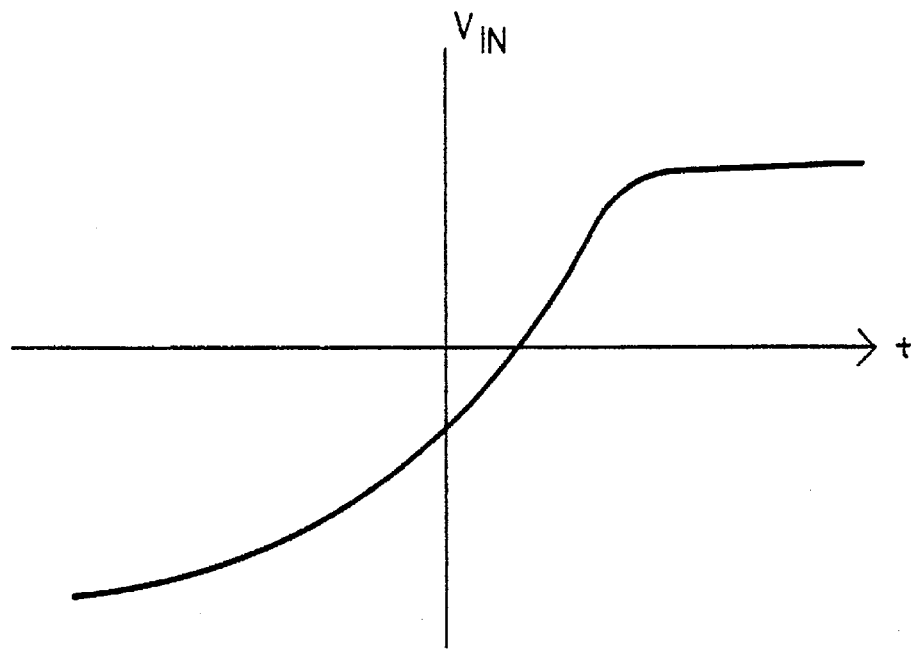

FIG. 9A illustrates a typical monotonically increasing analog input for an analog to digital converter.

Figure 9B:
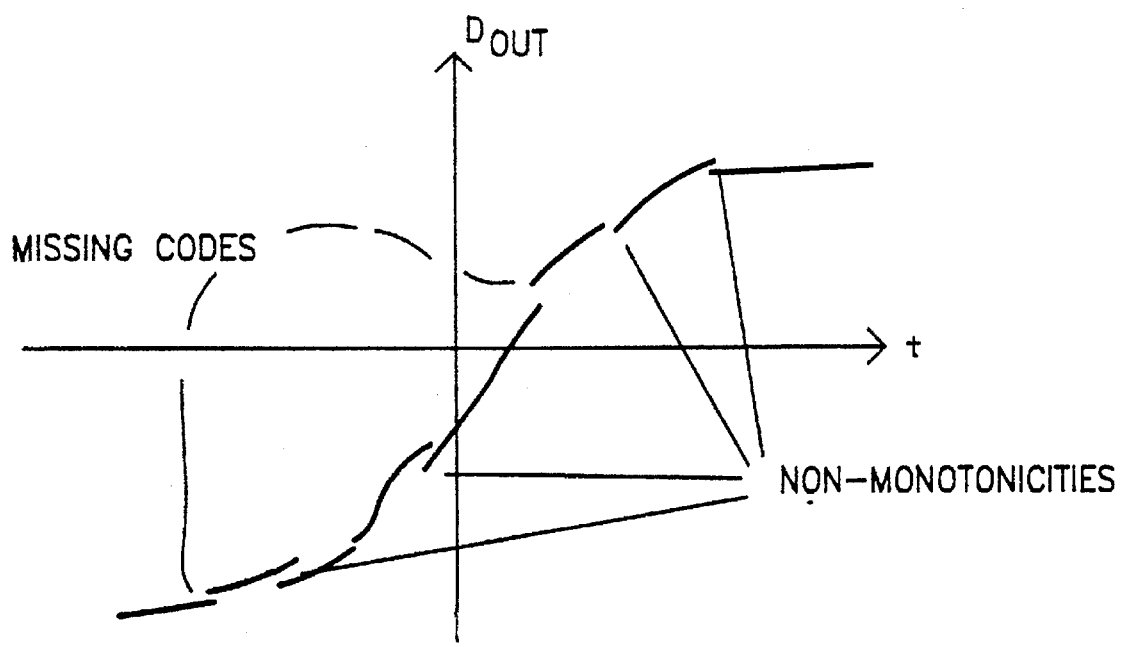

FIG. 9B illustrates digital converter output for an input such as FIG. 9A where the output has missing codes and non-monotonicities.

Figure 9C:
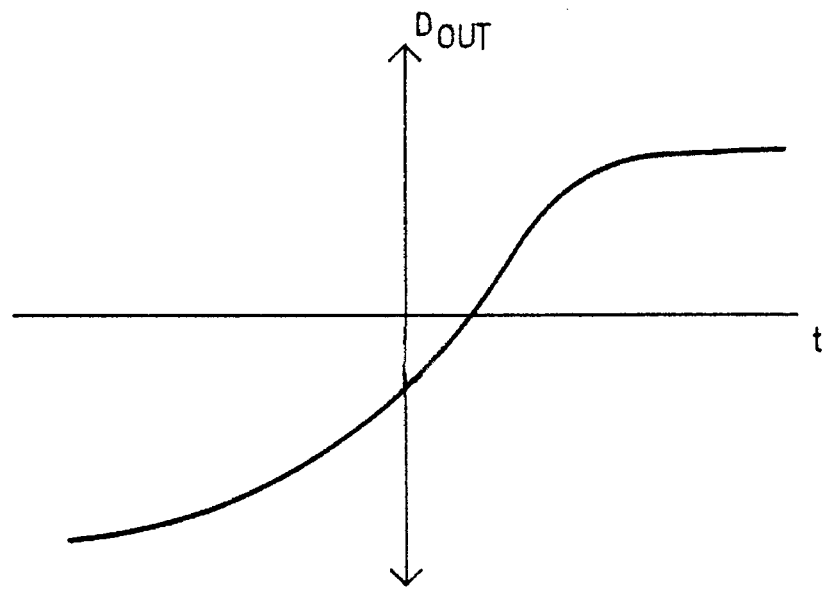

FIG. 9C illustrates digital converter output for an input such as FIG. 9A where the output does not have missing codes and non-monotonicities.

Figure 10:
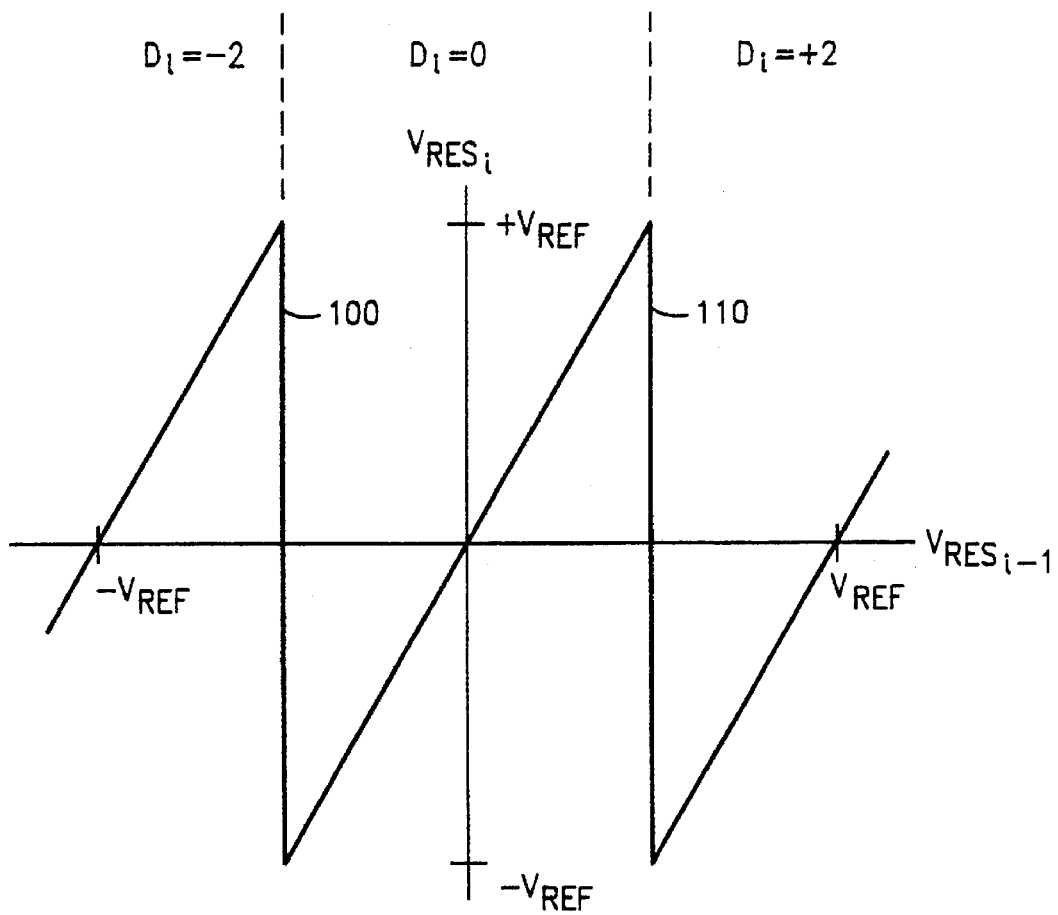

FIG. 10 shows the ideal residue transfer characteristic for the overflow reduction stage of the present invention.

Figure 11:
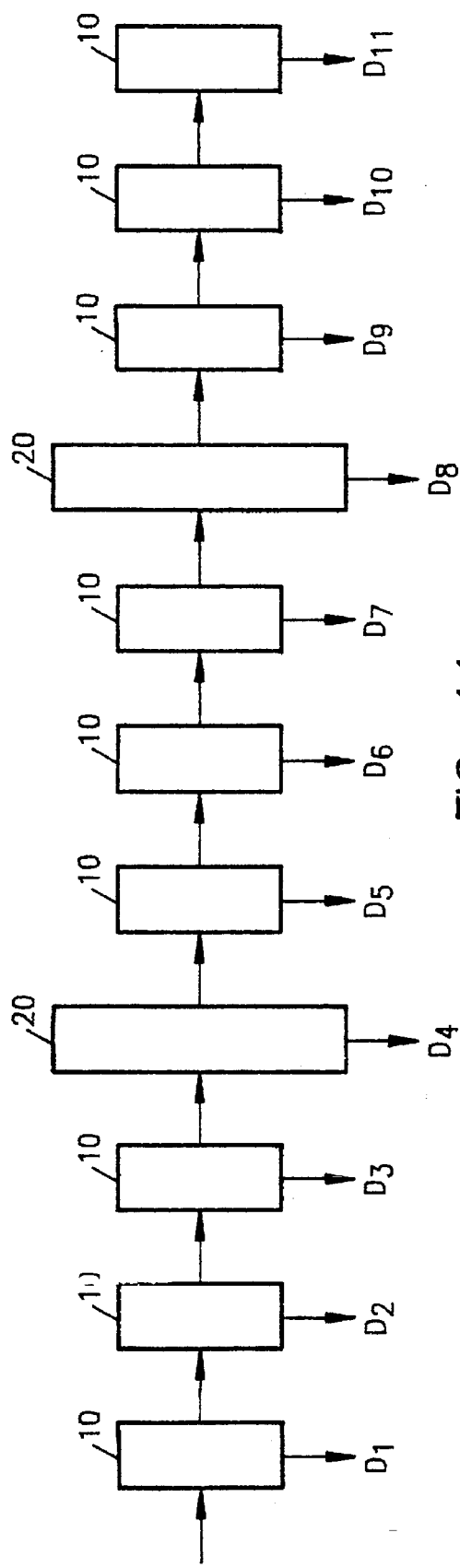

FIG. 11 depicts a pipelined 11-bit converter using overflow reduction stages according to the present invention.

Figure 11A:
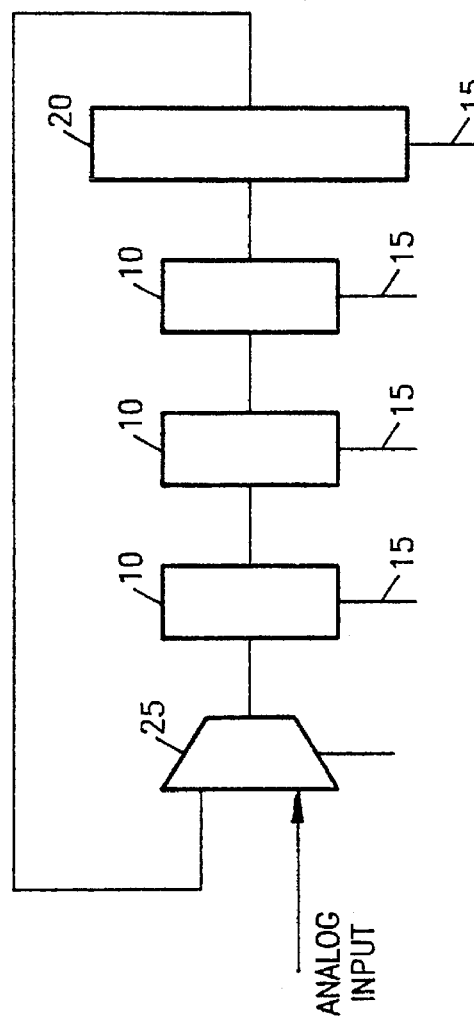

FIG. 11A depicts a recirculating algorithmic implementation of a converter using an overflow reduction stage of the present invention.

Figure 12:
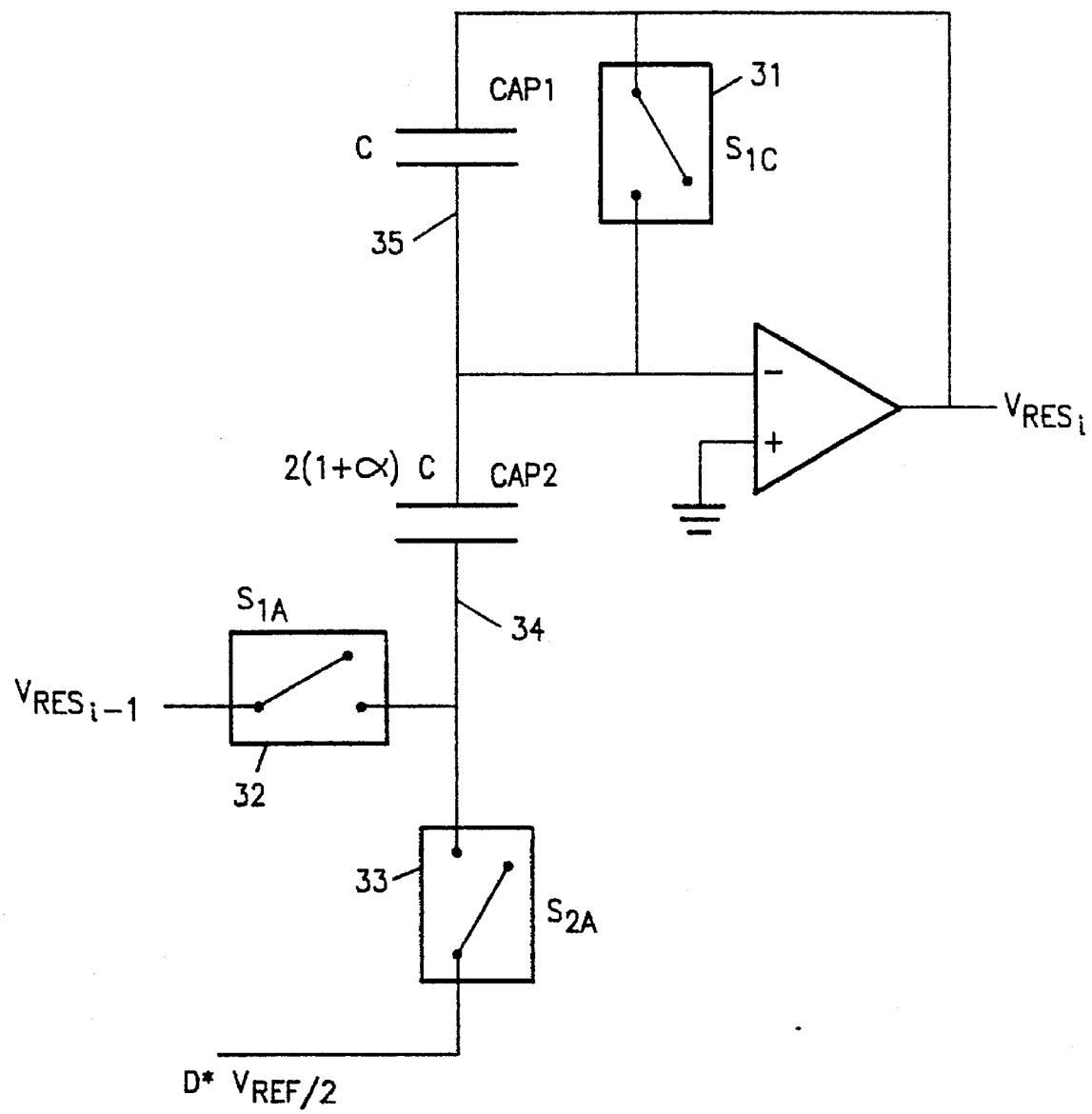

FIG. 12 shows a circuit implementing an overflow reduction stage according to the present invention.

Figure 13A:
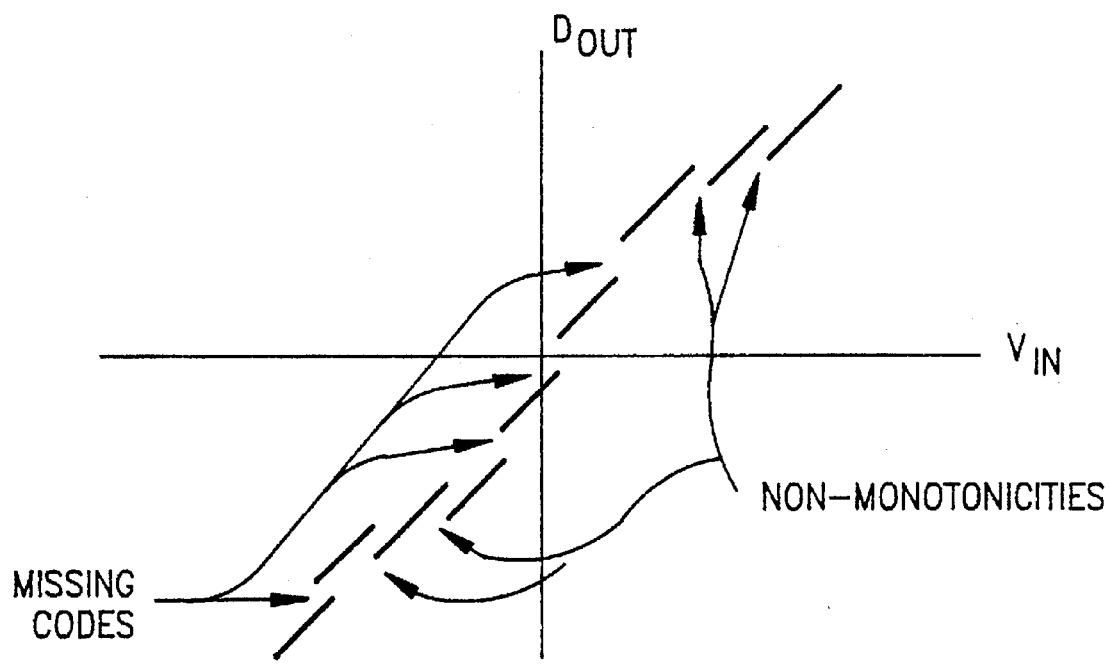

FIG. 13A illustrates the input/output transfer characteristic of a prior art analog to digital converter having non-monotonicities and missing codes.

Figure 13B:
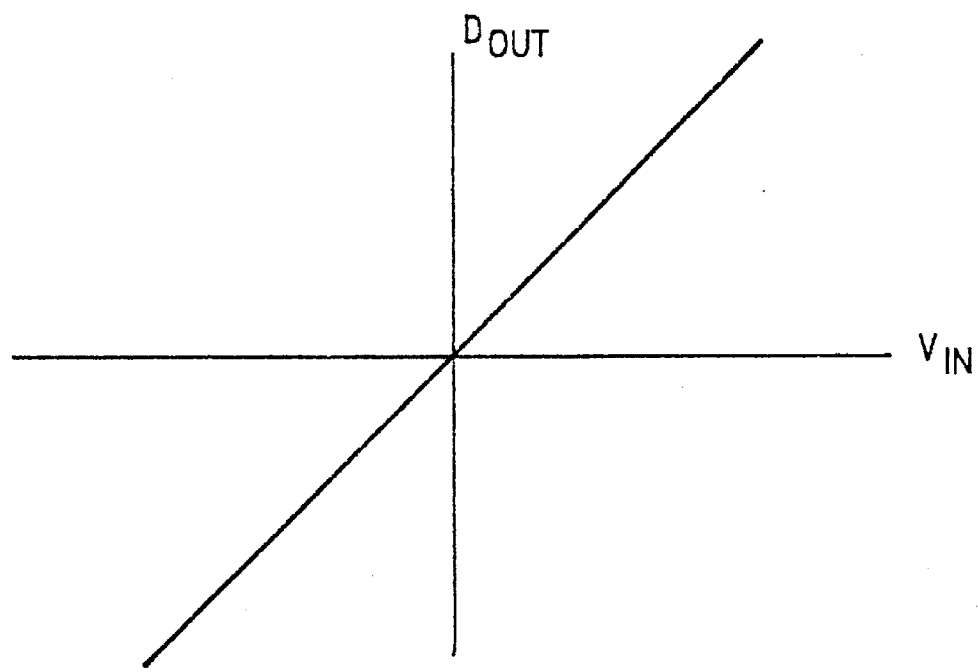

FIG. 13B illustrates the input/output transfer characteristic of an ideal analog to digital converter.

Figure 14:
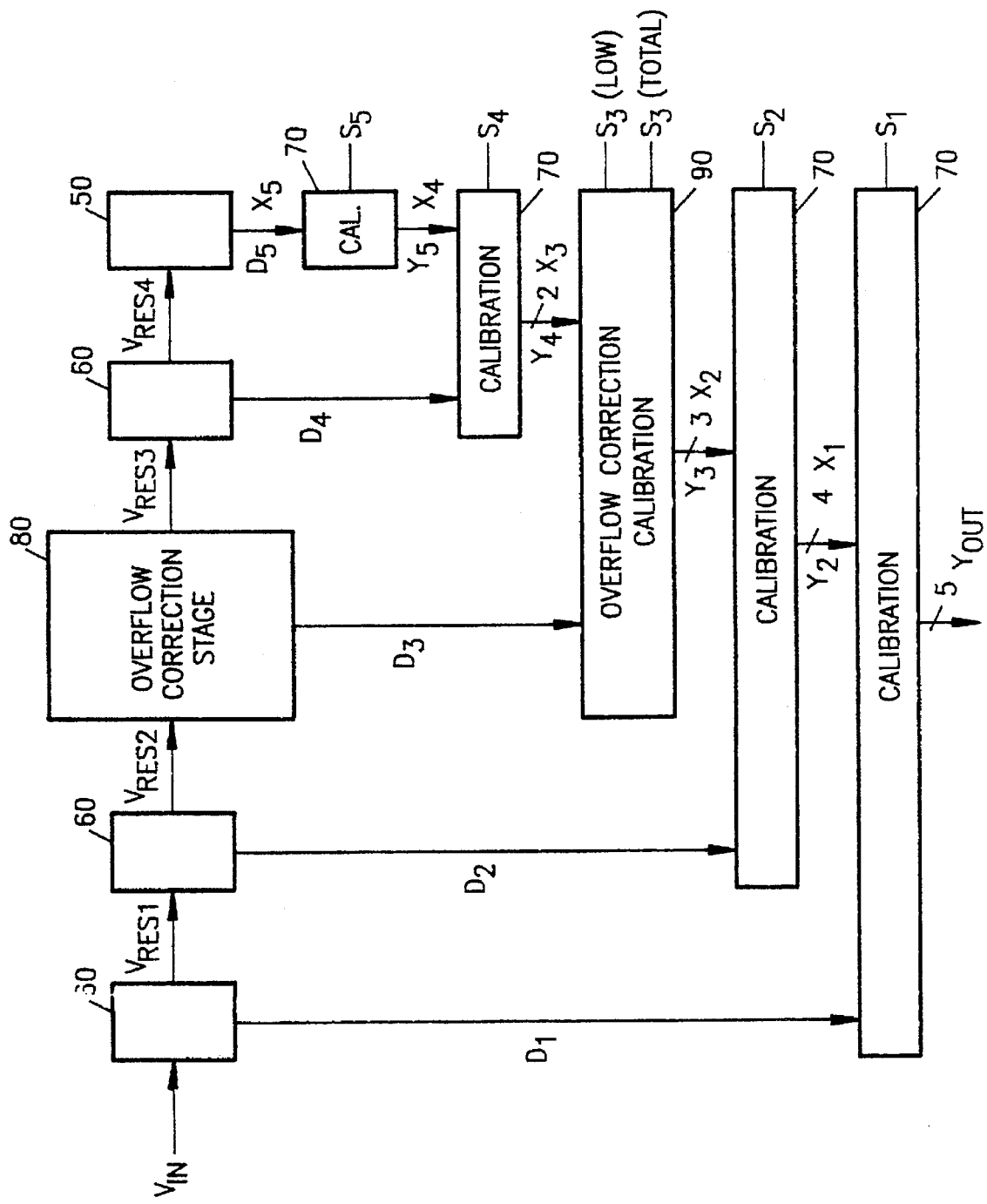

FIG. 14 depicts the self-calibration of a pipelined 5-bit analog to digital converter according to the present invention.

Figure 15:
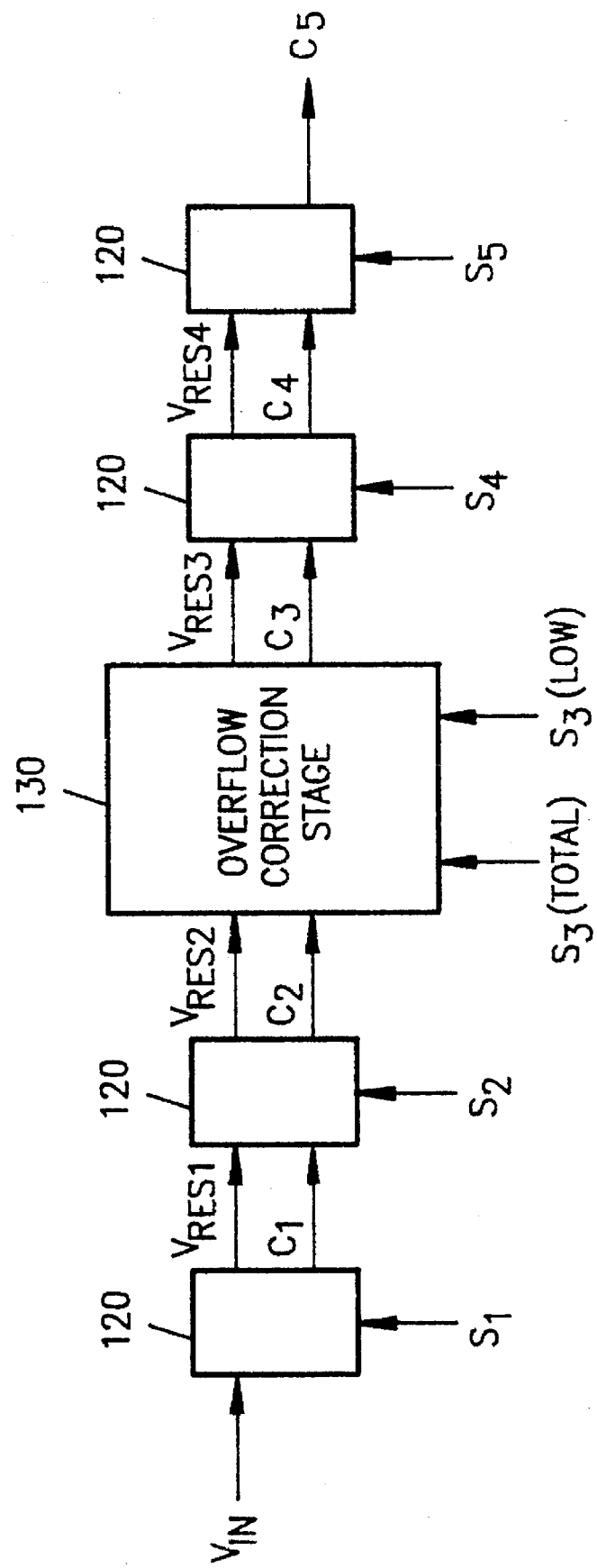

FIG. 15 depicts a self-calibrated, pipelined 5-bit analog to digital converter that performs pipelined correction according to the present invention.

DETAILED DESCRIPTION OF THE INVENTION

A major goal of analog to digital converter design of the present invention is to maintain the mathematical elegance of a self-calibration algorithm, but in such a way as to not require a complex digital radix conversion circuit. As discussed above, previous schemes do not guarantee monotonicity because of the presence of redundant states. The present invention solves both of these problems by first maintaining a radix 2 gain structure throughout the entire gain path of the converter. Since the gain in each stage varies from two only by the amount due to circuit imperfections, which is usually a small amount, the interstage gain error is on the order of 0.4%. The reduced radix circuits purposefully introduced gain variations on the order of 5% or more. These interstage gain errors multiply as they pass through the converter, thus the overall gain error for an N-stage converter is as follows:

$$(2-\alpha)^N = 2^N \left(1 - \frac{\alpha}{2}\right)^N \quad (17)$$

The ideal gain is $2^N$. Therefore, if it is assumed that each stage has an average gain error of $\alpha$, the actual total gain is wrong by the factor of $$\left(1 - \frac{\alpha}{2}\right)^N.$$

For levels of $\alpha$ near zero, this is approximated by the following.

$$\left(1 - \frac{\alpha}{2}\right)^N \approx 1 - N\frac{\alpha}{2} \text{ for small } \alpha \quad (18)$$

In the present invention, each stage is designed to have a gain of two, any gain errors will be uncorrelated and, therefore, the overall gain is likely to be very close to two.

This means that if the error per stage $\alpha$ is small enough and the number of stages N is small enough, the output can be adjusted simply by multiplying the output by $$\left(1 + N\frac{\alpha}{2}\right).$$

This is true because of the following:

$$\text{for small } x, \frac{1}{1-x} \approx 1 + x \quad (19)$$

The actual non-approximated correction value is the following expression:

$$\frac{1}{\left(1 - \frac{\alpha}{2}\right)^N} \quad (19A)$$

However, the approximation multiplication operation can actually be simplified significantly from a full-blown multiplication if the design has been done carefully so that it is possible to insure that the accumulated error $$N\frac{\alpha}{2}$$

is small enough. The reason the correction can be simplified is that if $$N\frac{\alpha}{2}$$

is small, then $$1 + N\frac{\alpha}{2}$$

has at most a few least significant fraction bits that are non-zero. Almost all of the fraction bits are zero. Therefore, the "multiplication" becomes merely at most a few shifted additions.

Since the preferred embodiment of the radix 2 system of the present invention is implemented in VLSI, it is possible to lay out the converter so that any process variations that might cause gain errors are negatively correlated with each other. For instance, if there is a doping gradient on the chip, some converter stages might have a positive error while others would have a negative error of an equal and offsetting magnitude. This means that process variations will not cause overall gain error, and that any overall gain variation is essentially random and is very small.

For example, assume the average per stage error cc is on the order of 0.4%, which is estimated as being more than three standard deviations from the mean of zero in a typical layout and process. Being three standard deviation from the mean, 99.9% of the converters will have a lower average $\alpha$. If the number of stages N is 11, and an eight bit output is desired, the actual correction factor is 2.226630408%, whereas the error as determined by approximations 18 and 19 is 2.2%. The most significant 12 bits of the approximation and the true value of the error are equal. Since only eight bits of output are required, the approximation works just free. In binary, the correction multiplier in this case is 1.00000101101. Since only an eight bit output is required, this multiplication is accomplished with only a one shift and addition of the raw output according to the present invention since only one of the first seven fraction bits is non-zero.

In contrast, prior art radix<2 systems purposefully design an $\alpha$ on the order of 7% (as in Karaniclas et at.) into the converter. If $\alpha$ is set to 7%, the approximations show a correction of 38.5% where the true correction should be 47.97881772%. Here the approximation and the true correction value agree to within only four bits. Since an eight bit result is desired, the approximations can not be used. Alternatively, a very complicated radix conversion circuit equivalent to a series of nested multiplications must be used to convert the raw output using the actual unapproximated conversion factor. The above discussion illustrates the great advantage to maintaining a radix 2 structure.

The present invention allows for the maintenance of a radix 2 structure while eliminating the chance of "range overflow error". This type of error, discussed above, occurs when the input to a stage is above $+V_{ref}$ or below $-V_{ref}$ so that the output of that stage is twice as far out of range, resulting in that stage and all the remaining stages latching to the same meaningless output value.

FIG. 10 shows a residue transfer function for a novel 1.5 bit "overflow reduction" stage according to the present invention. In the present invention, the redundancies are removed by redesigning the residue.

FIG. 11 shows an 11-bit pipelined converter constructed using the present invention. Nine of the stages 10 are of the standard 1 bit per stage variety well known in the art. However, overflow reduction stages 20 are placed at the fourth and eighth stages. The exact pipelined sequence of overflow stages with 1-bit stages is not critical. There should be enough overflow reduction stages to alleviate overflow errors occurring in the manufacturing process used for producing the converter.

The overflow reduction stage has two very desirable qualities. First, the peaks of this residue occur when the input residue is at $+\frac{1}{2}V_{ref}$ and $-\frac{1}{2}V_{ref}$. This means that the gain peaks do not coincide with the other 1 bit stages, so that an A/D converter built with a combination of both designs will be as insensitive to charge injection and amplifier offsets as the prior art design constructed solely of cascaded 1.5 bit stages.

Assume that the previous stage suffered from one or more of the many causes of error, and that its residue input was unlucky enough to be at a level which produced an output that was above $+V_{ref}$ or below $-V_{ref}$. Since the residue transfer function for the overflow reduction stage for inputs near $+V_{ref}$ and $-V_{ref}$ has no discontinuities and output a residue near zero, the overflow reduction stage has the extremely important characteristic that it reduces the out-of-range residue input into an in-range residue output. Catastrophic geometric overflow growth is eliminated. It is desirable to place the overflow reduction stages strategically in the converter, so that there is never a chance that any out of range input can multiply enough to reach a power supply voltage before that residue is brought back into appropriate input range by an overflow reduction stage. Thus, to insure correct conversion, the designer will determine what the worst case overflow for a stage will be and how much far out of range any stage can operate before the output becomes non-linear (or flat in the worst case when the power supply is reached). A carry overflow stage will be inserted into the converter chain so that overflow will be reduced before any non-linearities could occur.

It is worth noting that just because the output of a 1-bit stage is out of range, the subsequent outputs which all have the same value prior to overflow reduction are not necessarily meaningless, so long as the supply voltage has not been reached to destroy the gain of the residue transfer characteristic. This is because the situation which leads to an out of range output occurs when the voltage is very near the discontinuity boundary of the residue transfer characteristic. Consider the case where in a radix 10 converter, for instance, the analog input corresponds to a digital value of 9995412 and the first stage detects the first 9. It is perfectly natural for two other 9's to follow, depending upon how close the input voltage was to the boundary. However, if one of the converters sends a residue that is out of range that is multiplied by 10 each stage, the system will run up against the supply voltage limit. In that case, if the supply voltage is reached before the fourth stage, where a 5 is supposed to be output, the overall converter output will be 9999999, and the accuracy will be lost at that point. The correct overall output could have been salvaged if an overflow reduction stage had been used. Any error due to imperfect gain or mismatch can be calibrated and corrected so long as the converter stages remain in their linear ranges and do not slam up against the power supply.

FIG. 11A depicts another possible use of the overflow reduction stage. This is a recirculating algorithmic implementation. In this design, there is a mini-pipeline of some number of 1-bit per stage sections 10 followed by one overflow reduction stage 20. The residue of the overflow correction stage is fedback to the first stage through the analog multiplexor 25. In this manner, a small converter chain can be used to generate a high resolution output. Each stage produces output bits through digital output lines 15. Most pipeline schemes can also be used as algorithmic converters in this manner.

A second very important characteristic of the overflow reduction stage is that it introduces a gap into the output codes so that multiple representations of the same code are not possible. Although the overflow reduction stage has three possible digital output states $D_i$, those output states are $D_i=-2$, $D_i=0$, and $D_i=+2$. This introduces number gap into the raw code when this stage is reached because the differences between $-2$ and 0, and between 0 and 2 is greater than one code. Most of the stages are standard 1 bit stages, and although this overflow reduction stage has three possible output values, the fact that there is a number gap in its output reduces the possibility of multiple representations of the same code. There are no multiple representations possible in part because each Equation 9A and 9B have only 1 possible solution.

To illustrate this, assume that output $D_i$ comes from an overflow reduction stage, thus $D_i$ has possible values of 2, 0, and $-2$. $D_{i+1}$ necessarily has a 1 bit representation of 1 or $-1$, since overflow reduction stages should not be directly cascaded with each other since there is no advantage to doing so. In this case, the only solution to Equation 6A ($2D_i+D_{i+1}=-1$) is $D_i=0$ and $D_{i+1}=-1$. The only solution to Equation 6B ($2D_i+D_{i+1}=1$) is $D_i=0$ and $D_{i+1}=1$. Since neither Equation has multiple solutions, the multiple representations inherent in a the prior art 1.5 bit per stage architecture are eliminated. Furthermore, the possible values taken on by the $D_i D_{i+1}$ viewed as a binary number are as follows.

$$2D_i+D_{i+1}=5,3,1,-1,-3, \text{ or } -5$$

if $D_i=2,0,$ or $-2$, and $D_{i+1}=1$ or $-1$

Now assume that input $D_i$ is a 1 bit stage, and $D_{i+1}$ is a overflow reduction stage. Thus, $D_i$ has possible values of 1 or $-1$, and $D_{i+1}$ has possible values of $+2$, 0, and $-2+\text{tm}$ (20) . In this case, $D_{i+1}$ is viewed as representing two binary orders of magnitude. Thus, the possible values taken on by $D_i D_{i+1}$ viewed as a binary number are as follows.

$$4D_i+D_{i+1}=6,4,2,-2,-4, \text{ or } -6 \text{ if } D_i=1 \text{ or } -1, \text{ and } D_{i+1}=2,0,\text{or } -2 \quad (21)$$

Note that neither of the above representations contains a code for zero. Note also that there are no multiple representations for any of the possible output codes. Each output code has only one combination of $D_i$ and $D_{i+1}$ which represents that code. Because the minimum difference between any number having $D_i=2$ and any number having $D_i=-2$ is greater than 1 least significant bit, there is a number gap in the output code when the carry occurs and the transition is made from $D_i=2$ to $D_i=-2$.

FIG. 12 shows an overflow reduction stage according to the present invention. During the first phase of the non-overlapping clock, Switches $S_{1C}$ 31 and $S_{1A}$ 32 are closed, and Switch $S_{2A}$ 33 is open. Capacitor Cap2 34 has a capacitance which is twice as high as the sum of Capacitor Cap1 35 and some mismatch error $\alpha_i$. Capacitor Cap1 35 is held to zero volts during this phase, while capacitor Cap2 34 samples Vres$_{i-1}$. During phase 2 of the nonoverlapping clock, Switches $S_{1C}$ 31 and $S_{1A}$ 32 are open, while Switch $S_{2A}$ 33 is closed. During phase 2, $D_i*V_{reff2}$ is connected to Cap2 34. The residue transfer function for this circuit is below.

$$Vres_i = \left[ (2+\alpha_i)Vres_{i-1} - \left(1+\frac{\alpha_i}{2}\right)D_i Vref \right](1-\epsilon_i) + Vofs_i \quad (22)$$

During phase 2, the output Vres$_i$ is generated according to the above transfer function.

Fully differential configurations of the converter are also possible. In a fully differential converter, each op amp has a positive and a negative output as well as a positive and negative input. In practice, most pipelined converter implementations are fully differential because the output swing of the amplifier is almost twice the single-ended configuration. This maximizes the signal to noise ratio on the chip. In addition, by using a diffential implementation, certain charge injection errors are substantially matched from positive to negative signal paths, then when they are subtracted Vout+−Vout−), the charge injection is essentially cancelled. Differential implementation is a standard technique, although most descriptions in the journals are described with single-ended amplifiers to make the drawings less confusing.

Digital self-calibration accomplishes the purpose of eliminating the missing codes and preventing non-monotonicities by insuring that the overall converter gain is linear. FIG. 13A shows an overall converter gain which has missing codes and non-monotonicities. FIG. 13B shows an overall converter output where there are no non-monotonicities or missing codes. On both Figures, the analog input voltage $V_{in}$ is plotted along the X-axis $V_{in}$, while the digital output is plotted along the Y-axis.

Figure 1:
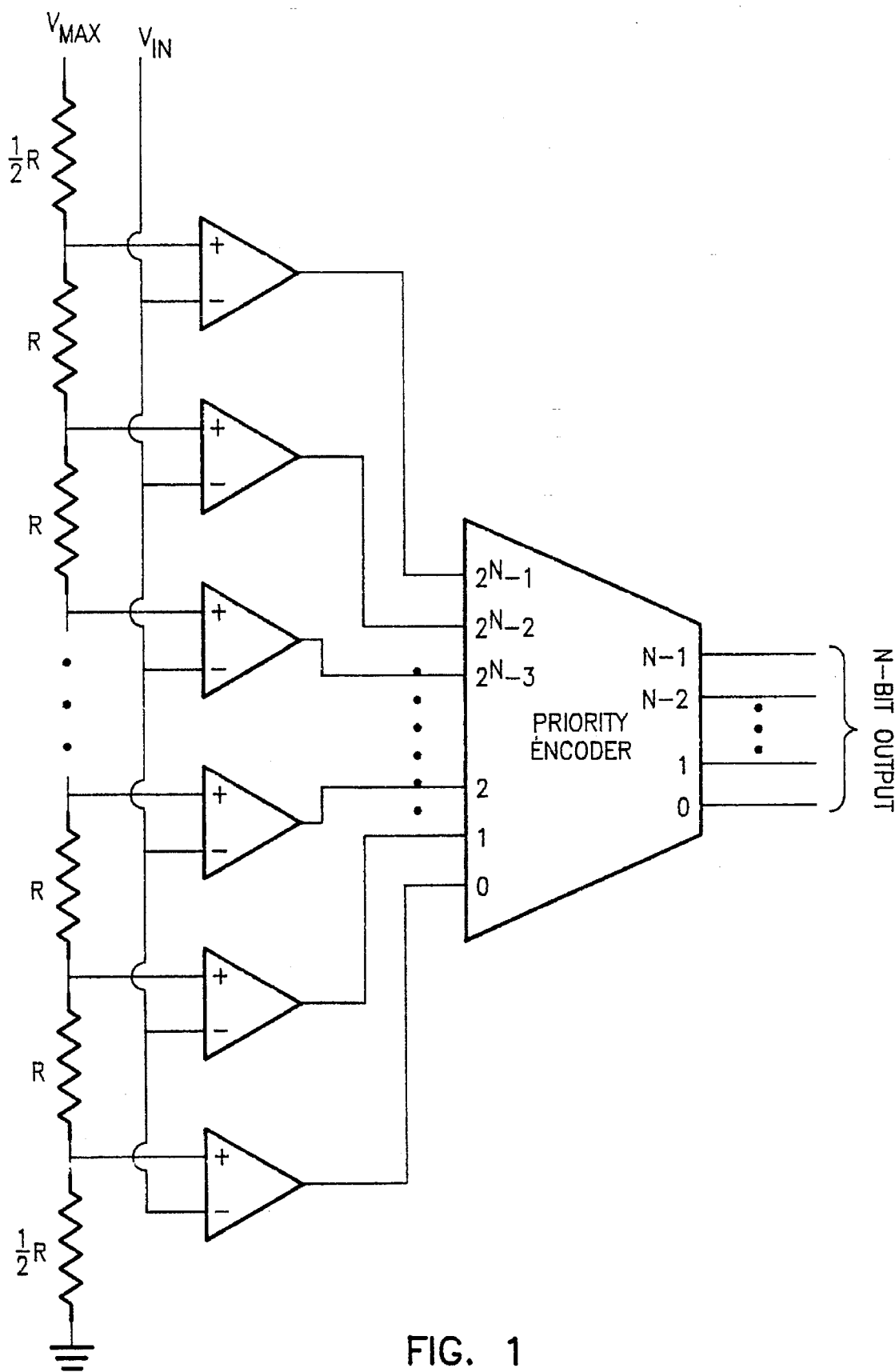
FIG. 1 illustrates a prior art flash-type N-bit analog to digital converter.
Figure 2:
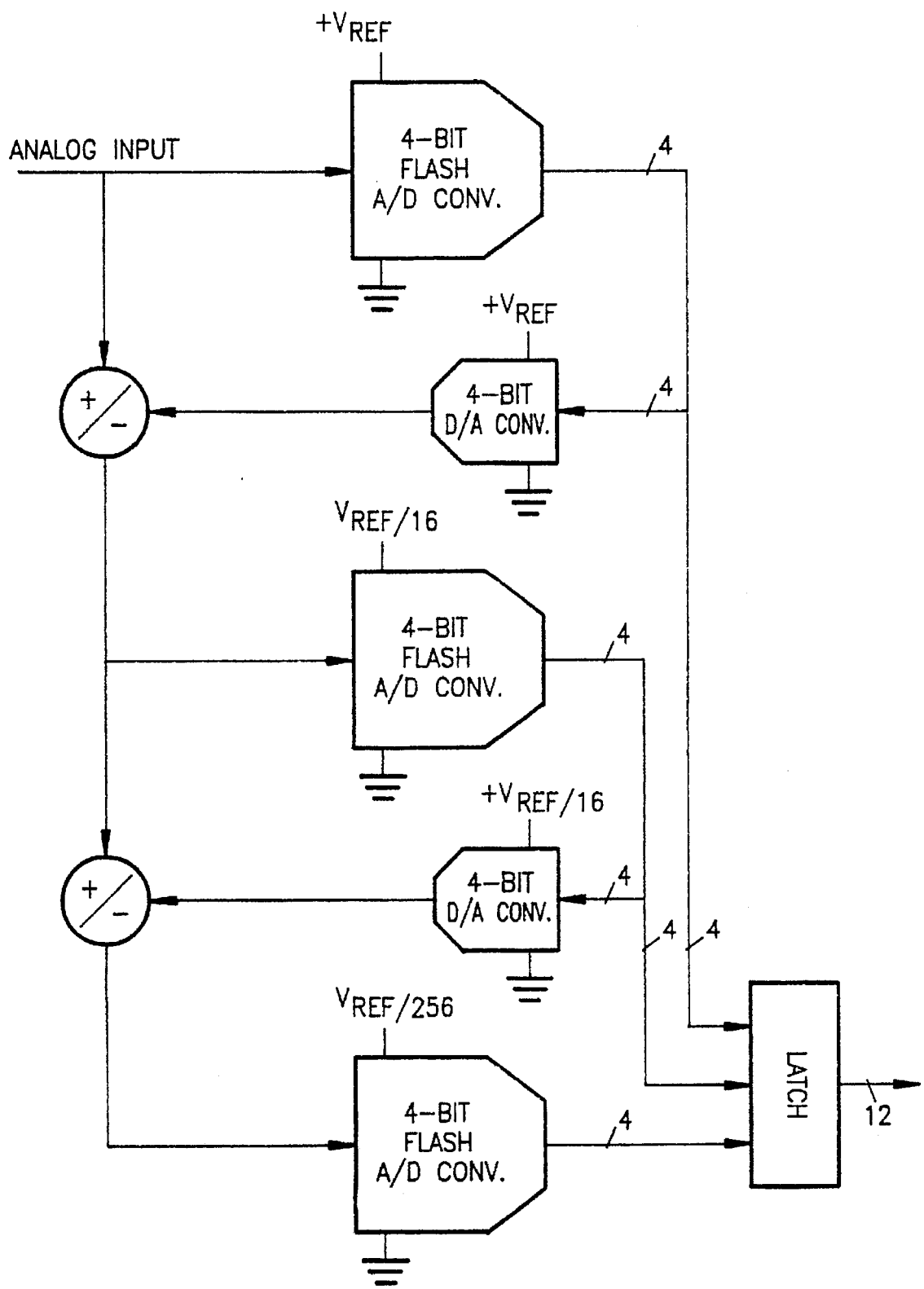
FIG. 2 shows a prior art multi-step 12-bit analog to digital converter.
Figure 3:
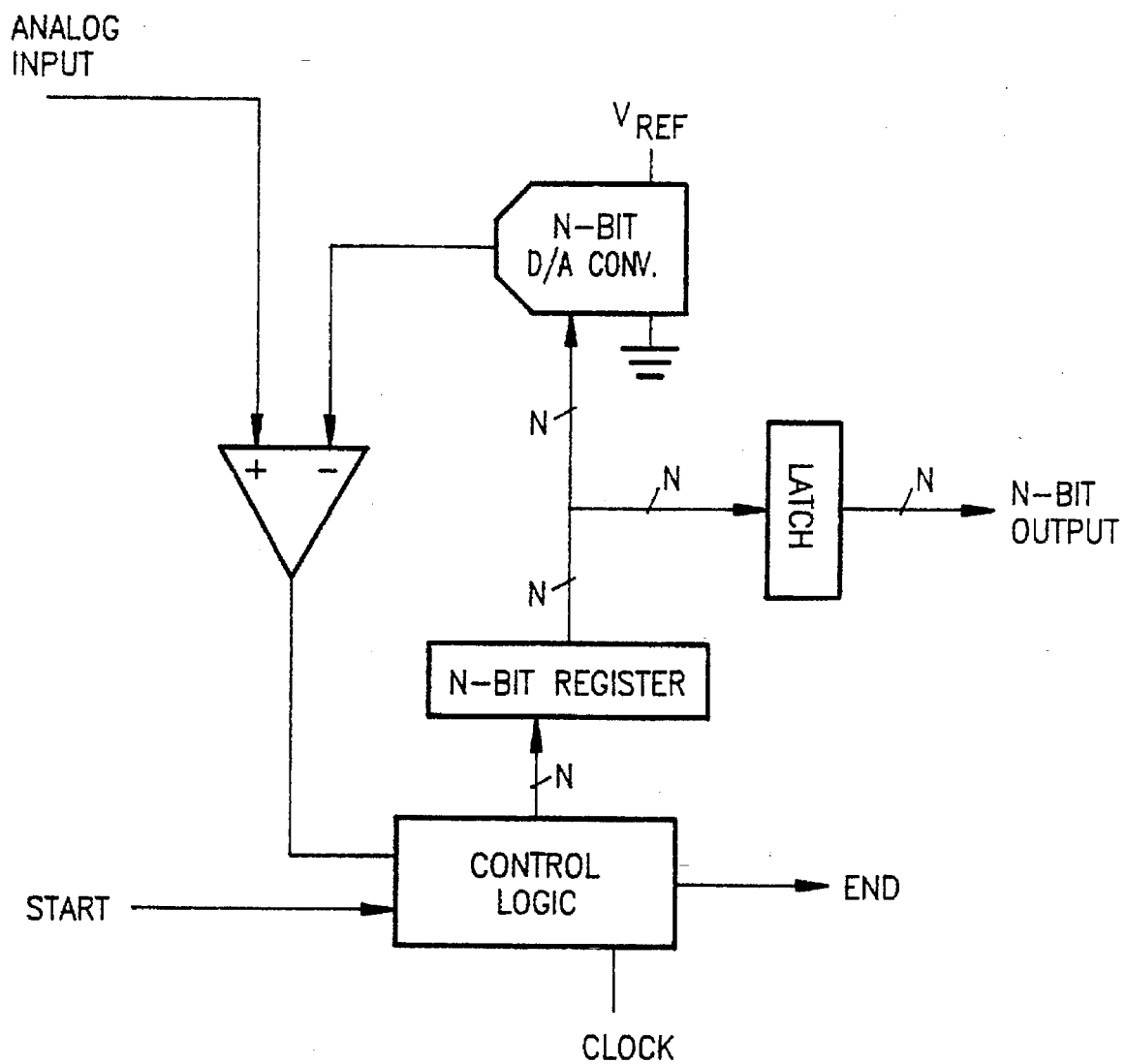
FIG. 3 illustrates a prior art successive approximation N-bit analog to digital converter.
Figure 4A:
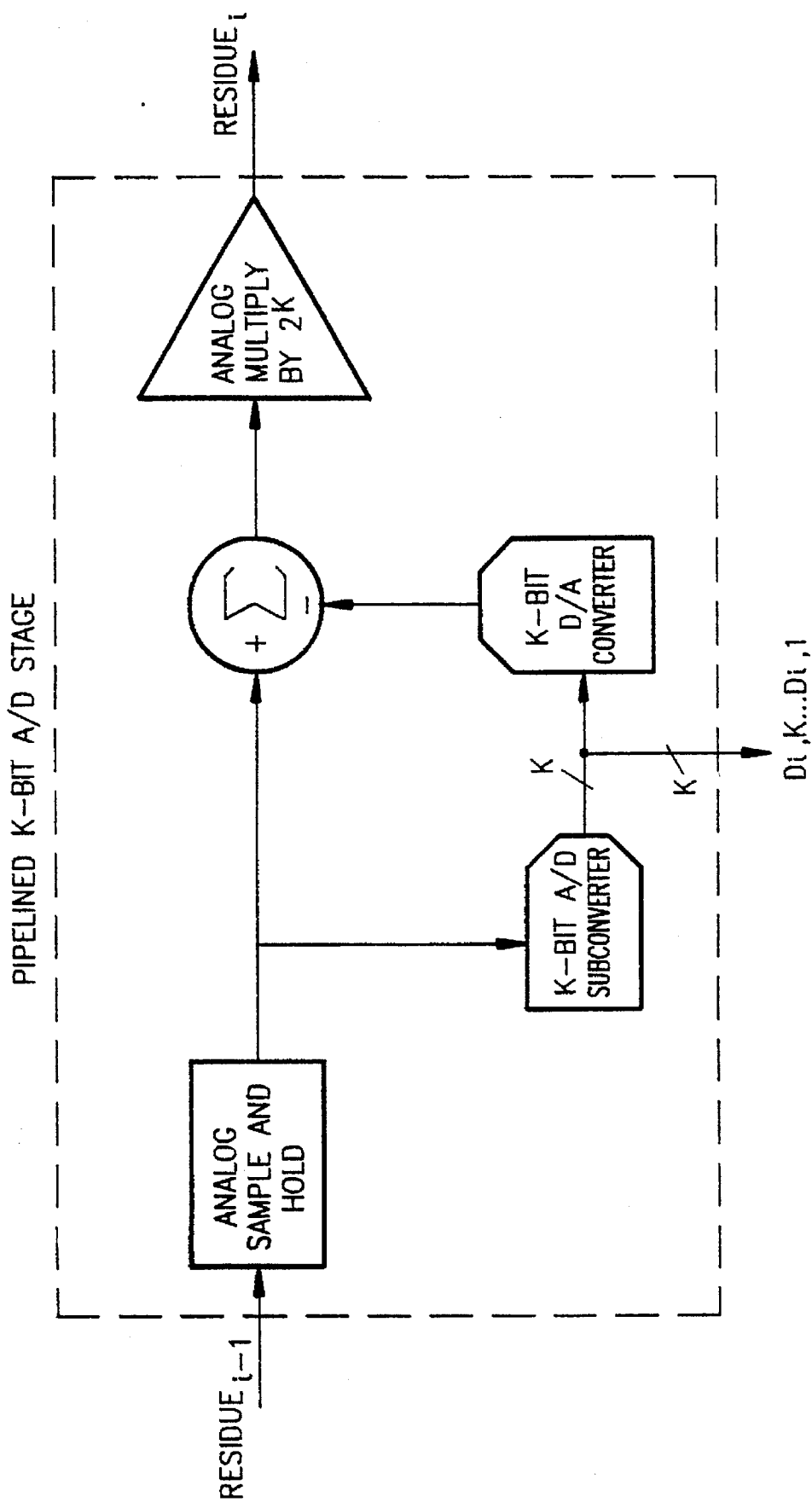
FIG. 4A shows a single K-bit converter stage of a prior art pipelined analog to digital converter.
Figure 4B:
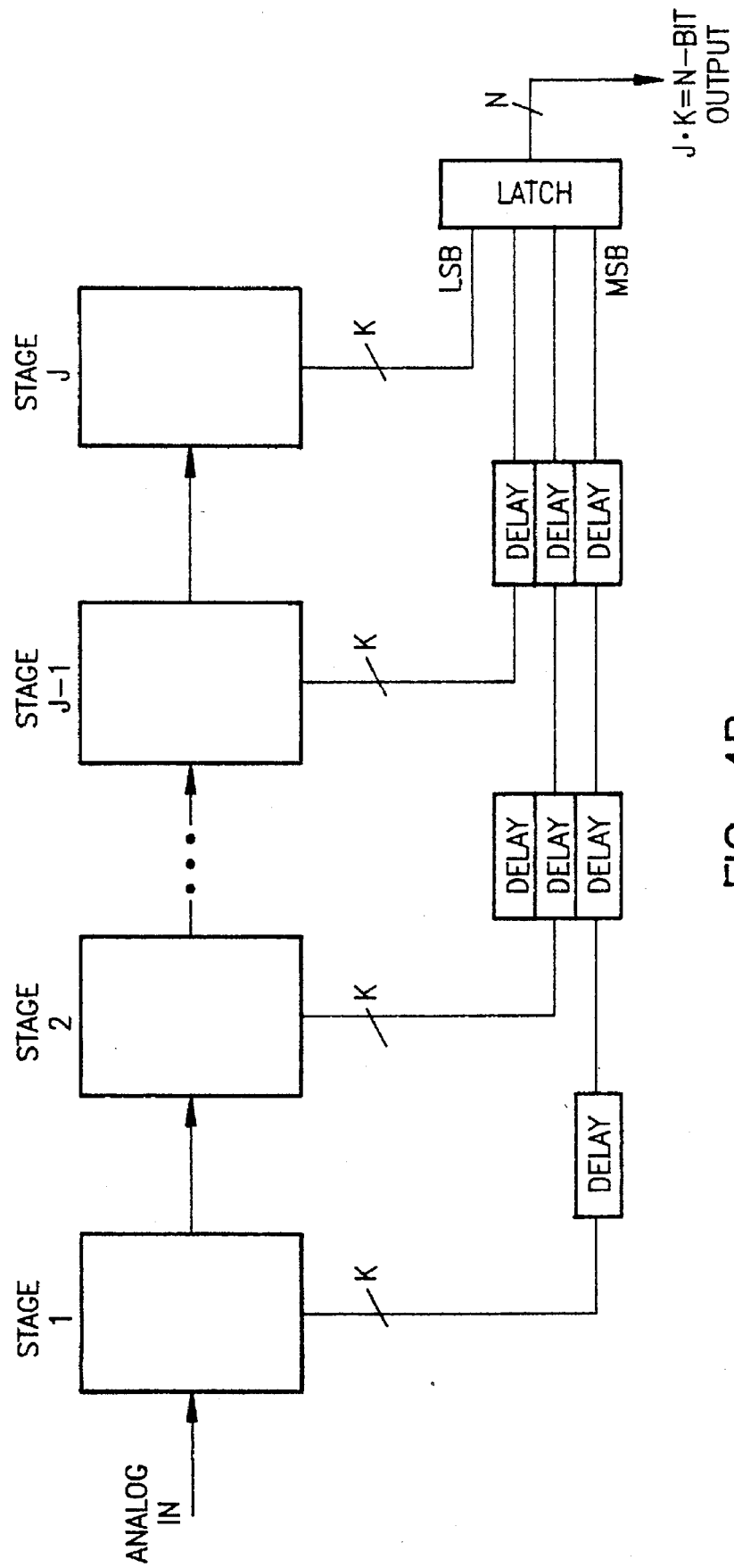
FIG. 4B depicts a prior art N-bit pipelined analog to digital converter using J separate instances of the K-bit converter stages shown in FIG. 4A.
Figure 5:
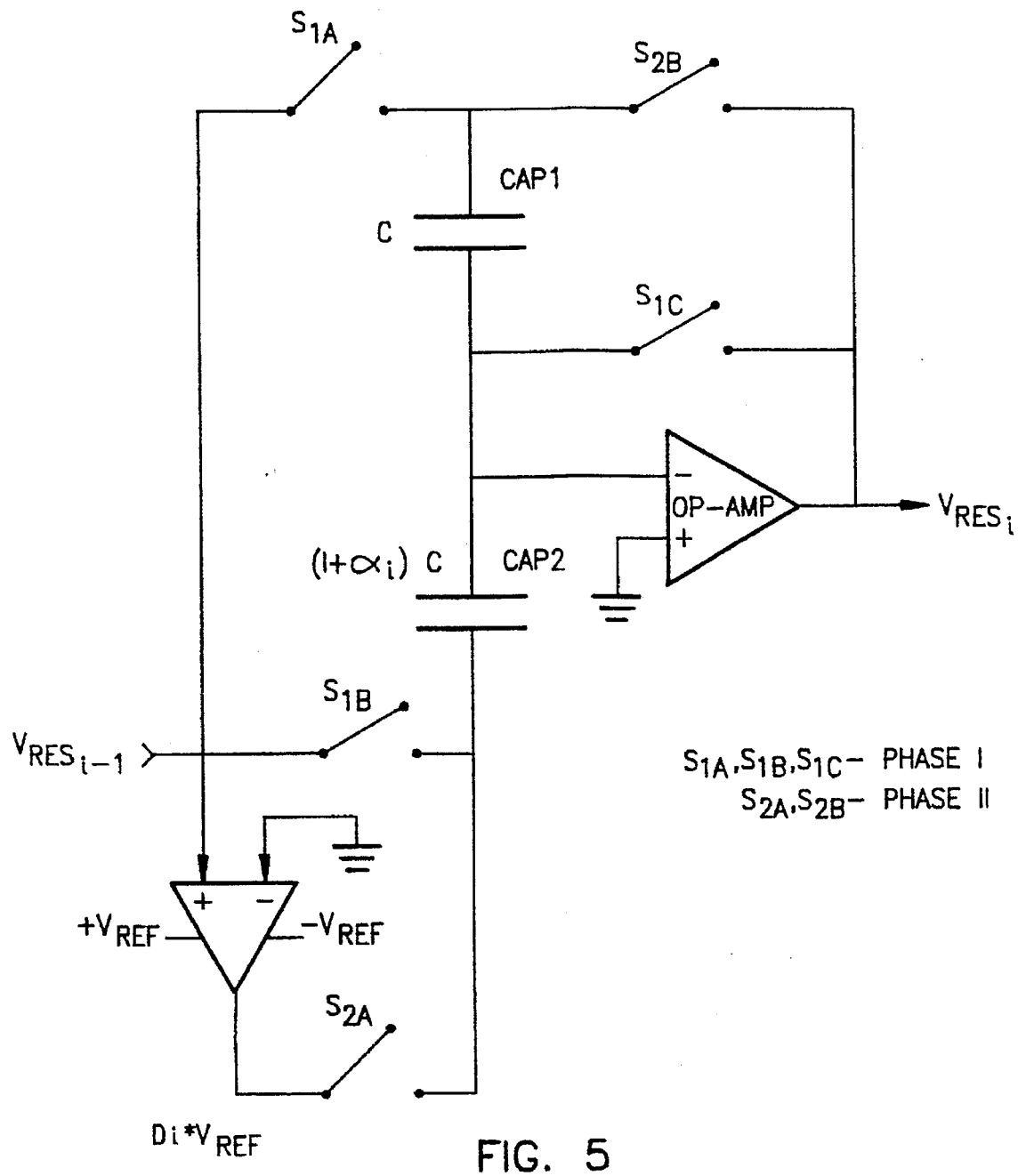
FIG. 5 shows a prior art circuit implementing a 1-bit converter stage using a two-phase non-overlapping clock.
Figure 5A:
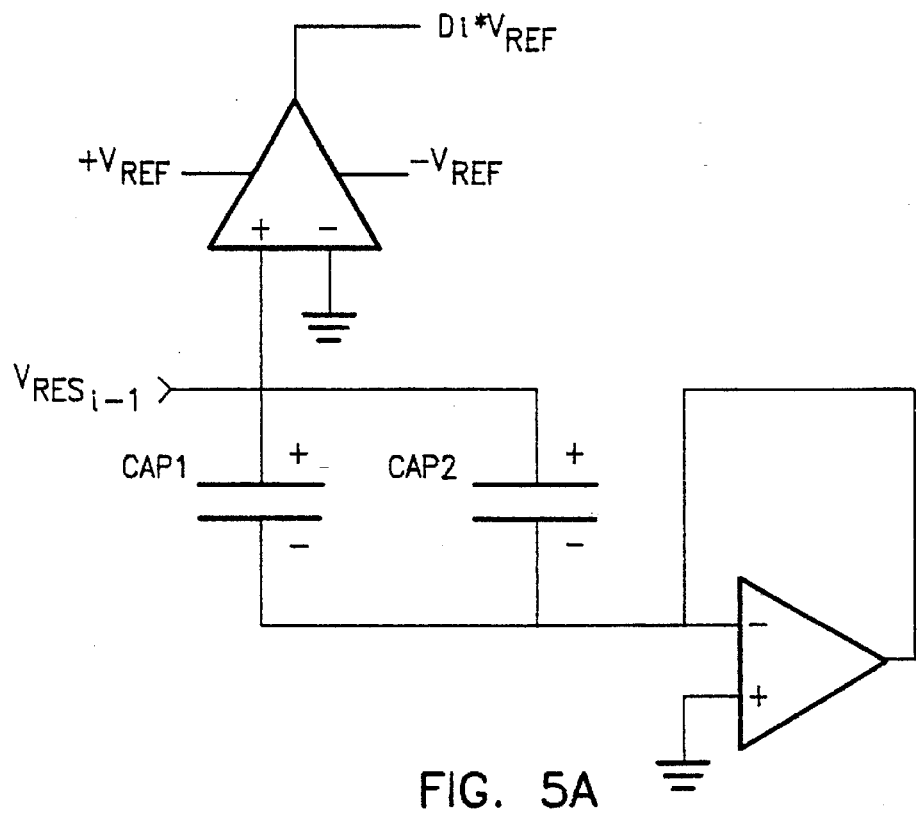
FIG. 5A shows the state of the prior art circuit of FIG. 5 during phase 1 of the non-overlapping clock.
Figure 5B:
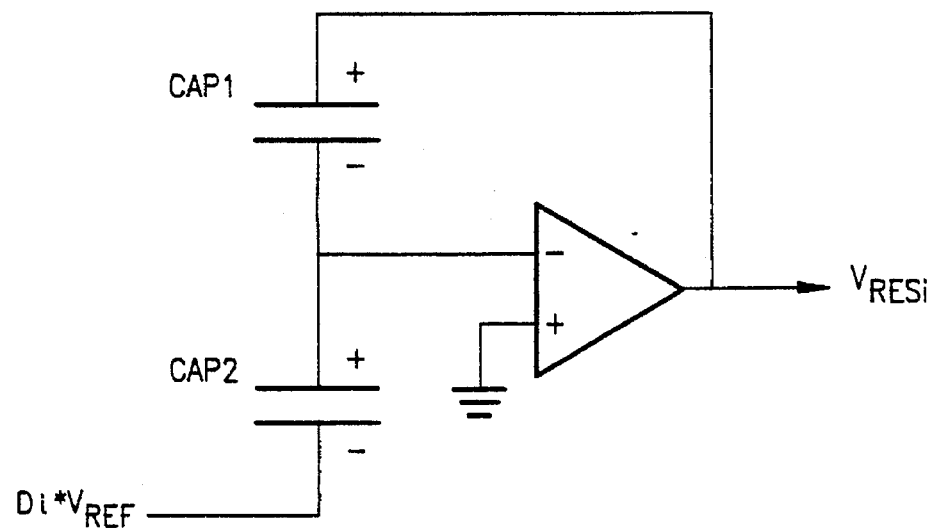
FIG. 5B shows the state of the prior art circuit of FIG. 5 during phase 2 of the non-overlapping clock.
Figure 6A:
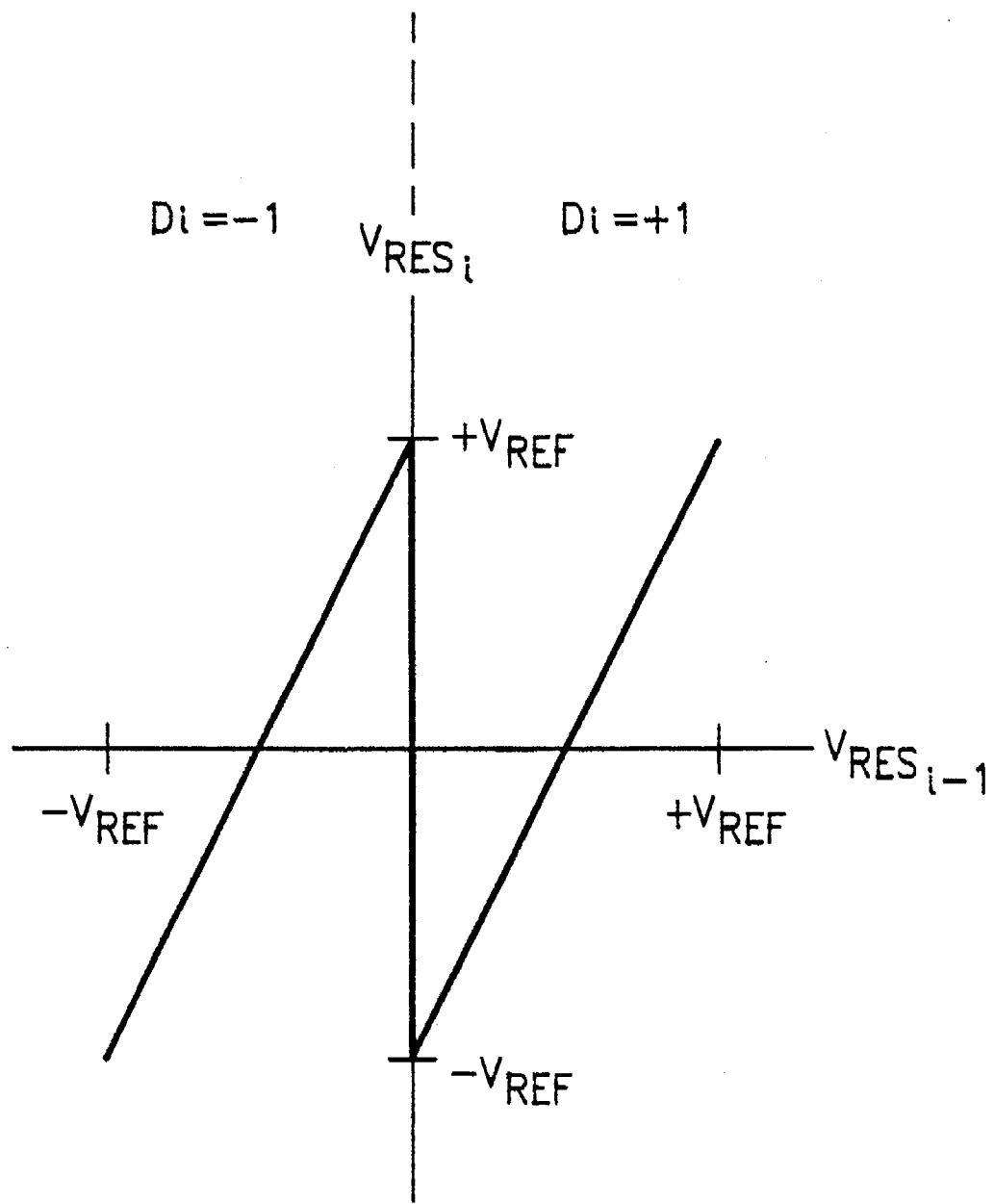
FIG. 6A shows the ideal residue transfer characteristic of a 1-bit radix 2 converter stage such as the one shown in FIG. 5.
Figure 6B:
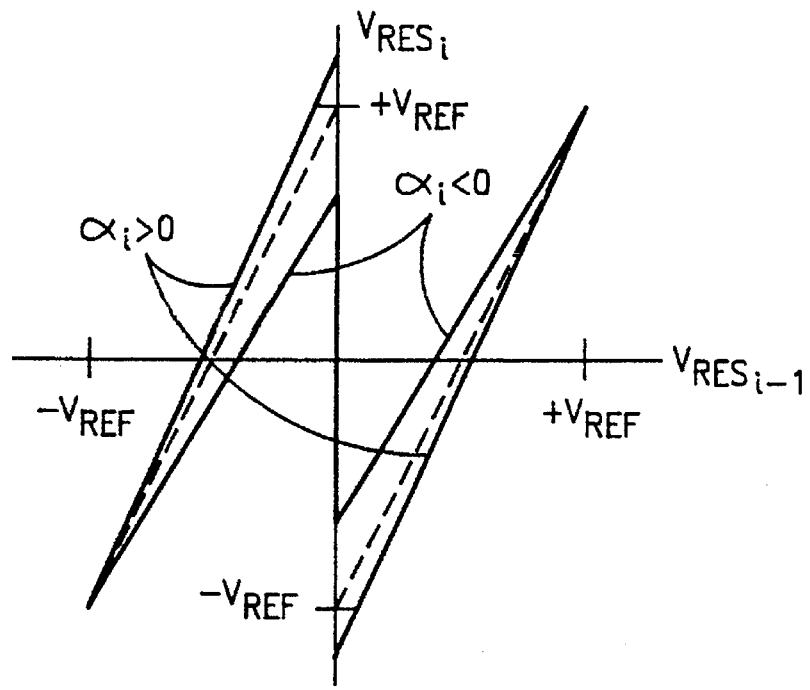
FIG. 6B shows the effect of capacitor mismatch on a 1-bit converter stage such as the one shown in FIG. 5.
Figure 6C:
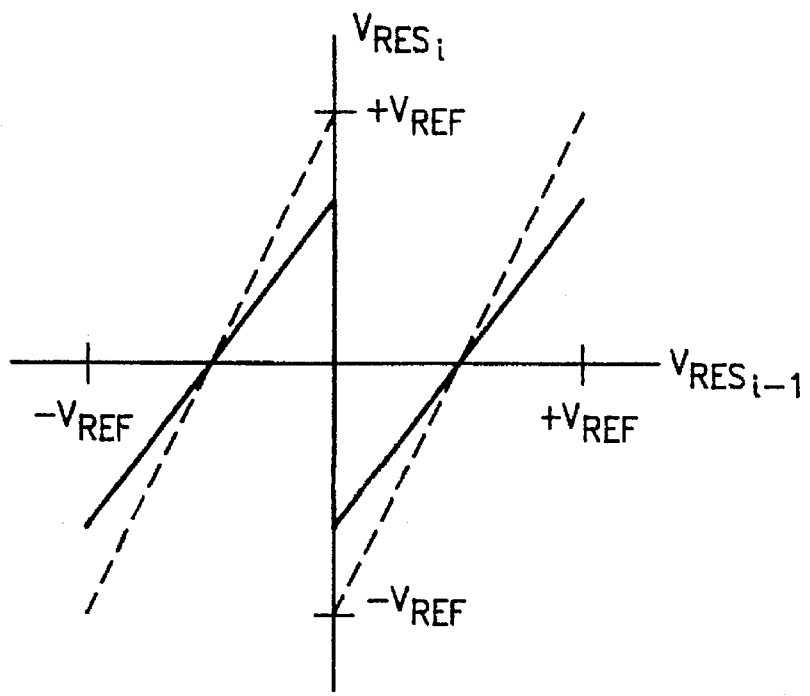
FIG. 6C shows the effect of finite amplifier gain and settling error on a 1-bit converter stage such as the one shown in FIG. 5.
Figure 6D:
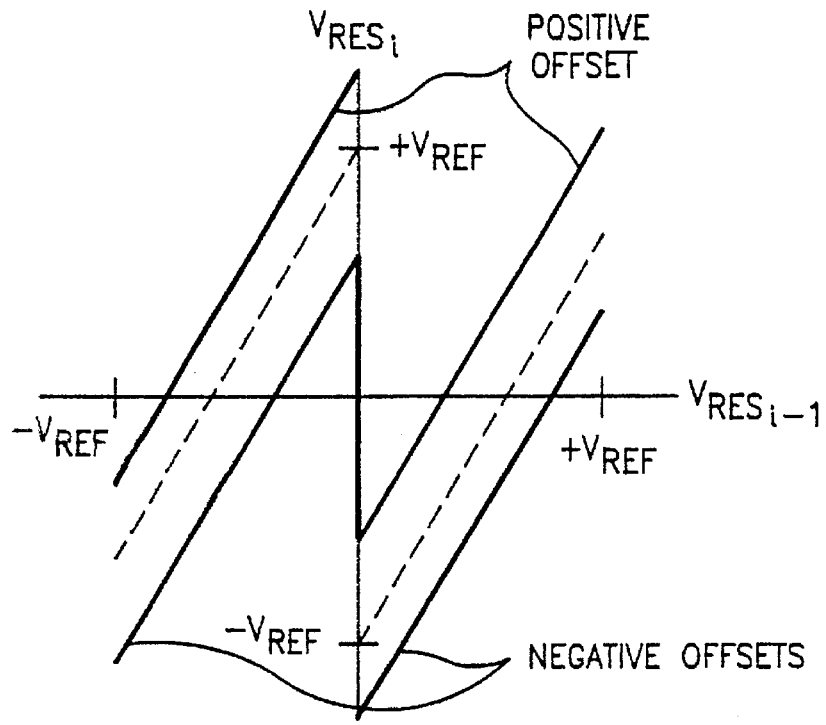
FIG. 6D shows the effect of charge injection or amplifier offset errors on a 1-bit converter stage such as the one shown in FIG. 5.
Figure 6E:
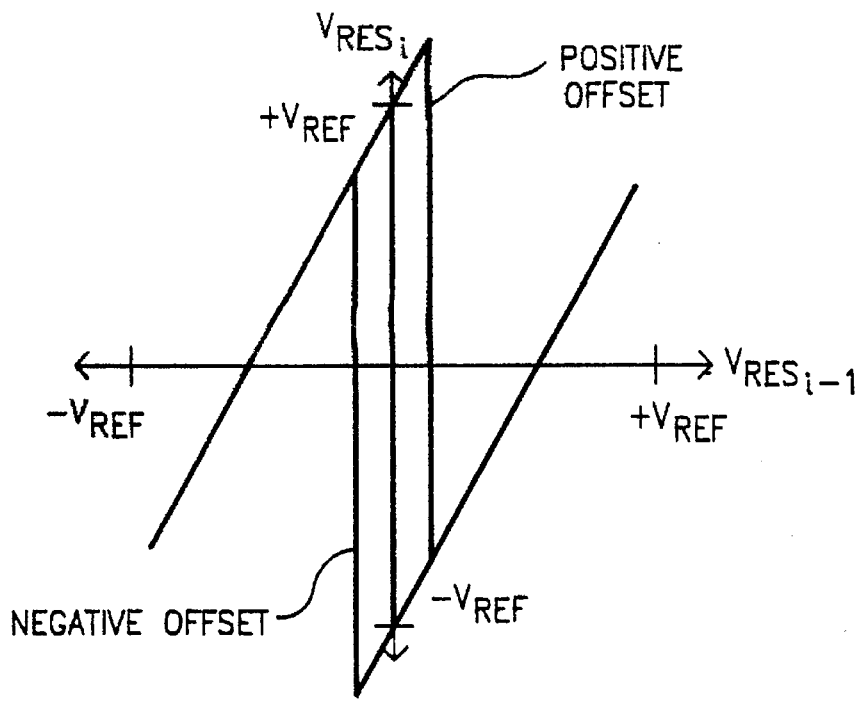
FIG. 6E shows the effect of analog to digital subconverter comparator offset errors on a 1-bit converter stage such as the one shown in FIG. 5.
Figure 7:
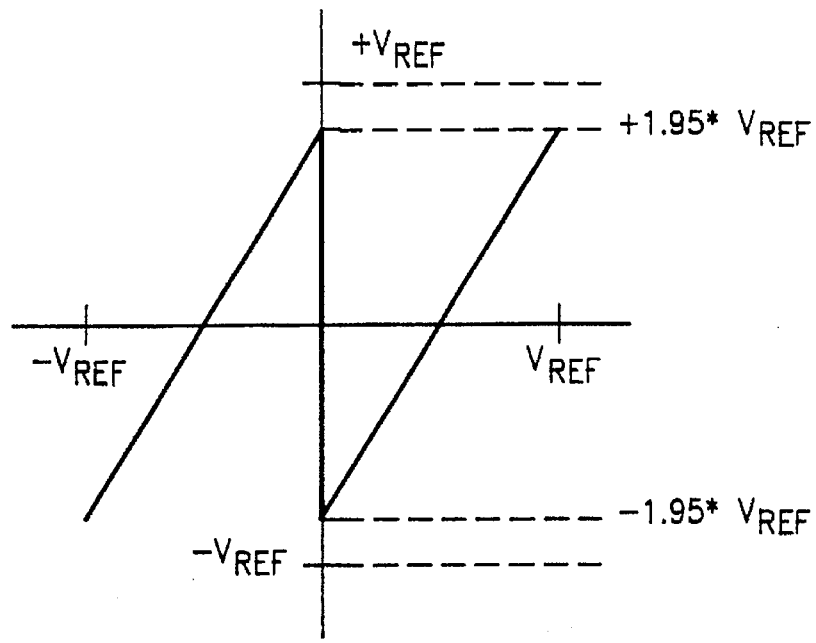
FIG. 7 shows the ideal residue transfer characteristic of prior art radix<2 converter stage.
Figure 8:
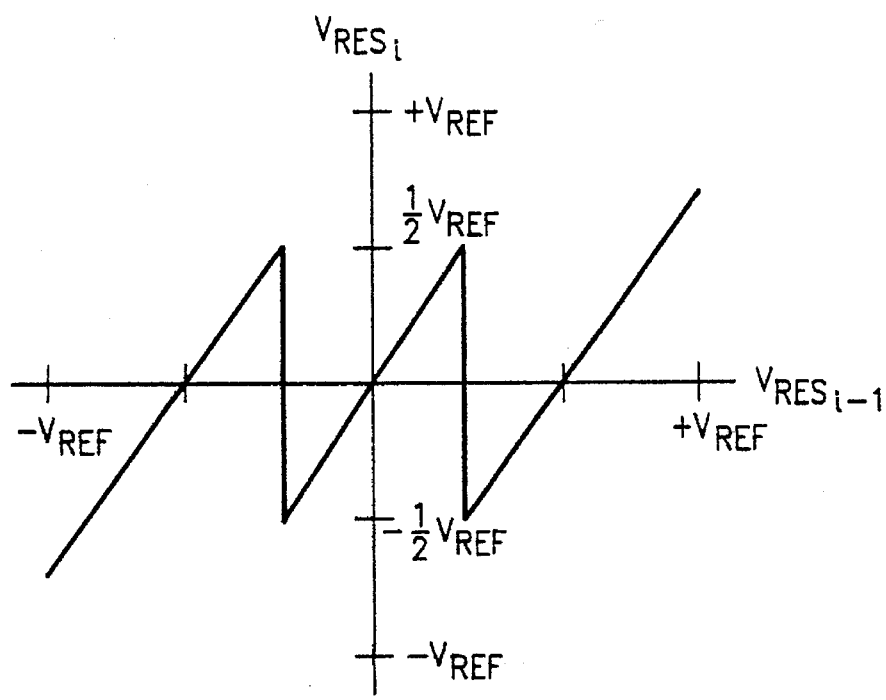
FIG. 8 shows the ideal residue transfer characteristic of a prior art 1.5-bit converter stage.

FIG. 14 shows the self-calibration structure of a five-bit pipelined converter having an overflow reduction stage 80 at stage 3. The digital self-calibration occurs beginning with the last stage 50 which produces the least significant results, which in this case is a 1-bit stage. During the calibration of the 1 bit stage 50, the input is forced to the discontinuity point which is at or near zero on FIG. 6A which shows the transfer characteristic for a 1-bit stage 50. The difference in voltage from the highest point on the left of the function (where $D_i=-1$) to the lowest point on the right of the function (where $D_i=1$) is determined. S1 and S2 correspond to the quantized representation of $V_{out}$ when $V_{in}=0$ with $D=-1$ and $D=1$, respectively.

The digital self-calibration algorithm can be represented as follows:

$Y_i = X_i$, if $D_i = -1$ $Y_i = X_i + S_i$, if $D_i = 1$ \hfill (23)

where $D_i$ is the bit decision, $X_i$ is the raw code, $S_i$ is $S1_i - S2_i$, and $Y_i$ is the transformed code. This transform ensures that the output code $Y_i$ with $V_{in}=0$ is the same for $D=-1$ and $D=1$, eliminating missing codes that might otherwise occur if the gain of the stage were less than two, and eliminating the non-monotonicity and duplicate codes that might otherwise occur if the gain of the stage were greater than two. This logic and arithmetic are performed by a calibration logic module 70 associated with each stage.

With the digital calibration of one stage 50 accomplished, the digital calibration of higher level stages 60 can proceed. FIG. 14 demonstrates a structure for this procedure. The calibrated least significant stage is now used as an A/D converter to measure the second to the last stage.

Digital self-calibration of an overflow reduction stage 80 is similar to self-calibration of a 1-bit stage and is performed by a corresponding module 90 using the following steps. $-V_{in}$ is forced to $V_{ref}/2$, which is at or near the first discontinuity 100 in the transfer characteristic shown in FIG. 10. Similar to a 1-bit stage, a digitized difference, $S_{low}$, is computed for this first discontinuity using the subsequent calibrated stages as an A/D converter. $V_{in}$ is then forced to $+V_{ref}/2$, which is at or near the second discontinuity 110. The digitized difference, $S_{high}$, is similarly computed.

The calibrated output Y for an overflow reduction stage is calculated as follows.

$Y = X$, if $D = -2$ $Y = X + S_{low}$ if $D = 0$ $Y = X + S_{low} + S_{high}$ if $D = 2$ \hfill (24)

To avoid having to perform two additions if $D=2$, the stage 80 can store the sum of $S_{low}$ and $S_{high}$ as $S_{total}$, and that quantity can be used to replace the last situation where $D=2$ with the following.

$Y = X + S_{total}$ if $D = 2$ \hfill (25)

Here, as well as in the other calibrated stages; at most one addition needs to be performed.

Once the self-calibration has been completed, the calibrated correction quantities may be added and used to correct the raw output in a pipelined fashion as shown in FIG. 15. FIG. 15 shows a 5-bit pipelined analog to digital converter which utilizes the quantities determined by self-calibration to produce a digital output C5. It is not necessary to wait until all the Di outputs are produced before adding in the correction quantities Si. Instead, each single bit stage 120 needs only a register to hold the corrected output code and an adder to selectively add in that stages' corrected code. The overflow correction stage 130 needs those elements as well as an additional multiplexor to select which correction quantity will be added if addition is required. In FIG. 15, Ci represents the corrected output code as it exists after stage i. C5 is the final corrected and calibrated output; no further processing is necessary.

While the present invention has been disclosed above with particular reference to the preferred embodiment shown, this has been presented by way of example, not by way of limitation. Those of ordinary skill in the art would be enabled by this disclosure to add to or modify this embodiment of the invention in various ways as needed and still be within the scope and spirit of the present invention as recited in the appended claims.

What is claimed is:

1. A method for correcting raw digital output of an analog to digital converter having a plurality of single bit stages with two digital output states and at least one overflow reduction stage having three digital output states to produce a corrected output, the method comprising the steps of:

for each single bit stage, selectively either adding or not adding to the raw digital output one digital correction quantity which corresponds to that stage from a set of predetermined digital correction quantities, wherein the selective adding or not adding depends upon the digital output state of that stage; and for each overflow reduction stage, selectively adding or not adding to the raw digital output one of two digital correction quantities which correspond to two of the output states of that stage from a set of predetermined digital correction quantities, wherein the selective adding or not adding depends upon the digital output state of that overflow reduction stage.

2. A method for correcting raw digital output of an analog to digital converter as in claim 1, wherein the selected adding or not adding step corresponding to each stage is performed prior to the production of the digital output state for the subsequent stage.

3. An apparatus for performing a multi-stage pipelined analog to digital conversion comprising:

at least one overflow reduction stage, each stage having a first digital output, a first analog input, and a first analog residue output, and each stage including, means for outputting the first digital output as a first logic value and a first analog residue which is substantially twice the sum of the first analog input plus a first predetermined reference level when the analog input is less than negative one half times the first predetermined reference level, means for outputting the first digital output as a second logic value and the first analog residue which is substantially twice the first analog input when the first analog input is between negative one half times the first predetermined reference level and positive one half times the first predetermined reference level, and means for outputting the first digital output as a third logic value and the first analog residue which is substantially twice the sum of the first analog input minus the first predetermined reference voltage when the first analog input is greater than positive one half times the first predetermined reference level; and at least one single-bit stage, each stage having a second digital output, a second analog input, and a second analog residue output, and each stage including, means for outputting the second digital output as a first logic value and a second analog residue which is substantially the first predetermined reference voltage plus twice the second analog input when the analog input is less than a second predetermined reference level, and means for outputting the second digital output as a second logic value and the second analog residue which is substantially sum of the negative of the first predetermined reference voltage plus twice the analog input when the analog input is greater than the second predetermined reference level.

4. An apparatus as in claim 3, wherein the apparatus is 1-bit, 11-stage, and the fourth and the eighth stages are overflow reduction stages, and all other stages are single-bit stages.

5. An apparatus as in claim 3, wherein a plurality of overflow reduction stages and a plurality of single bit stages are connected in a pipeline such that no two overflow reduction stages are directly cascaded.

6. An apparatus as in claim 3, wherein the apparatus is configured in an recirculating algorithmic implementation, such that one or more single bit stages are followed by one overflow reduction stage, and the first analog output is fedback to the second analog input.

* * * * *

UNITED STATES PATENT AND TRADEMARK OFFICE
CERTIFICATE OF CORRECTION

PATENT NO. : 5,668,549
DATED : September 16, 1997
INVENTOR(S) : OPRIS et al.

It is certified that error appears in the above-identified patent and that said Letters Patent is hereby corrected as shown below:

Col. 18, line 4, please delete "1-bit" and insert in place thereof --11-bit--.

Signed and Sealed this

Second Day of December,1997

Attest:

Attesting Officer

BRUCE LEHMAN

Commissioner of Patents and Trademarks